(12) United States Patent
Kim

(10) Patent No.: US 8,509,010 B2
(45) Date of Patent: Aug. 13, 2013

(54) INPUT/OUTPUT CIRCUIT AND METHOD OF SEMICONDUCTOR APPARATUS AND SYSTEM WITH THE SAME

(71) Applicant: SK hynix Inc., Icheon-si (KR)

(72) Inventor: Kwang Hyun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/733,025

(22) Filed: Jan. 2, 2013

(65) Prior Publication Data

US 2013/0114359 A1 May 9, 2013

Related U.S. Application Data

(62) Division of application No. 12/970,934, filed on Dec. 16, 2010, now Pat. No. 8,369,159.

(30) Foreign Application Priority Data

Oct. 29, 2010 (KR) ........................ 10-2010-0106862

(51) Int. Cl.
*G11C 7/1066* (2006.01)

(52) U.S. Cl.
USPC .... 365/189.15; 365/193; 365/194; 365/233.1

(58) Field of Classification Search
USPC ........................................................ 365/239
See application file for complete search history.

(56) References Cited

U.S. PATENT DOCUMENTS

| | | | | |
|---|---|---|---|---|
| 4,635,234 A | * | 1/1987 | Yamaguchi | 365/189.05 |
| 6,735,138 B2 | * | 5/2004 | Schroder et al. | 365/219 |
| 7,002,852 B2 | * | 2/2006 | Khang et al. | 365/189.15 |
| 8,036,052 B2 | * | 10/2011 | Lee et al. | 365/201 |

FOREIGN PATENT DOCUMENTS

| | | |
|---|---|---|
| JP | 08-339697 A | 12/1996 |
| KR | 1020080078232 A | 8/2008 |

* cited by examiner

*Primary Examiner* — Tan T. Nguyen
(74) *Attorney, Agent, or Firm* — William Park & Associates Patent Ltd.

(57) ABSTRACT

A system includes a controller which is capable of operating at one of a first speed and a second speed slower than the first speed; a semiconductor memory apparatus operating at the first speed; and an input/output device which is connected between the semiconductor memory apparatus and the controller, and configured to control input/output of signals between the controller and the semiconductor memory apparatus, wherein the input/output device operates in a normal mode which corresponds to the input/output of the signals between the controller operating at the first speed and the semiconductor memory apparatus and a test mode which corresponds to the input/output of the signals between the controller operating at the second speed and the semiconductor memory apparatus.

13 Claims, 14 Drawing Sheets

INPUT/OUTPUT CIRCUIT AND METHOD OF SEMICONDUCTOR APPARATUS AND SYSTEM WITH THE SAME

CROSS-REFERENCES TO RELATED APPLICATION

The present application claims priority under 35 U.S.C. §119(a) to Korean Application No. 10-2010-0106862, filed on Oct. 29, 2010, in the Korean Intellectual Property Office, which is incorporated herein by reference in its entirety as if set forth in full.

BACKGROUND

1. Technical Field

Various embodiments of the present invention relates to a semiconductor apparatus, and more particularly, to a semiconductor apparatus including an input/output circuit.

2. Related Art

A semiconductor apparatus is loaded on a test equipment and various tests are performed to check the normal operation and the operation characteristics of a product.

The operation speed and calculation capability of an electronic system are gradually augmented. Accordingly, demand for a higher speed semiconductor apparatus has been increased. As a semiconductor apparatus gradually operates at a higher speed, the operation speed of a semiconductor apparatus has exceeded the supportable limit speed of test equipments. Thus, it is often conceivable that the higher speed semiconductor apparatus cannot be tested for high speed operations in the contemporary test equipment. In other words, a semiconductor apparatus manufactured to operate at a high speed (hereinafter, referred to as a "high speed semiconductor apparatus") can be checked only for operation characteristics to the supportable limit speed of the contemporary test equipment for testing a semiconductor apparatus operating at a low speed (hereinafter, referred to as a "low speed test equipment"). Accordingly, it is necessary to invest in novel high speed test equipments capable of performing tests for the high speed operations of the high speed semiconductor apparatus. However, the investment in the new high speed test equipment requires huge costs, which in turn influences the manufacturing cost and the productivity of a semiconductor apparatus.

If it is possible to load and test the high speed semiconductor apparatus on the low speed test equipment, the necessity of the investment in novel high speed test equipments can be substantially lessened, and the manufacturing cost of a semiconductor apparatus can be reduced. Also, the capability of loading the high speed semiconductor apparatus on both the low speed test equipment and a high speed test equipment contributes to an increase in the productivity of a semiconductor apparatus. Accordingly, a high speed semiconductor apparatus capable of being tested on both the low speed test equipment and the high speed test equipment has been demanded in the art.

In a semiconductor memory apparatus such as a DRAM, the following problems exist in loading a high speed semiconductor memory apparatus on a low speed test equipment and testing the high speed operations of the high speed semiconductor memory apparatus.

First, the low speed test equipment cannot provide the high speed semiconductor memory apparatus with a high speed external clock necessary to ensure high speed operations. The external clock is inputted to an internal delay locked loop (DLL) circuit and is used to generate a DLL clock (CLK_DLL) for controlling a data output timing, and is inputted to an internal command generation circuit and is used to generate internal active, read and write commands and various timing signals responding to the internal commands.

Second, the low speed test equipment is incapable of providing data at a high speed to the high speed semiconductor memory apparatus. That is to say, not only the speed of the external clock which is provided to the high speed semiconductor memory apparatus by the low speed test equipment is low, but also the speed at which the low speed test equipment inputs data to the high speed semiconductor memory apparatus is low.

Third, the low speed test equipment is incapable of normally receiving the data which is outputted at a high speed by the high speed semiconductor memory apparatus. In order to ensure data exchange between a test equipment and a semiconductor memory apparatus, timing match should be implemented between data and a data strobe signal (DQS). In general, since the speed of transition of the logic value of the data received by the test equipment is set to match the speed of the external clock which is inputted to the semiconductor memory apparatus by the test equipment, the low speed test equipment cannot normally sense the transition of the logic value of the data outputted by the high speed semiconductor memory apparatus which operates at a speed higher than the speed of the external clock inputted to the semiconductor memory apparatus.

Fourth, the low speed test equipment is incapable of normally receiving the data strobe signal which is outputted at a high speed by the high speed semiconductor memory apparatus. As mentioned in the third reason why the low speed test equipment cannot load the high speed semiconductor memory apparatus and perform tests at a high speed, the low speed test equipment is incapable of normally sensing the transition of the logic value of the data strobe signal outputted by the high speed semiconductor memory apparatus which operates at a speed higher than the speed of the external clock inputted to the semiconductor memory apparatus.

SUMMARY

In one exemplary aspect of the present invention, a system includes: a controller which is capable of operating at one of a first speed and a second speed slower than the first speed; a semiconductor memory apparatus operating at the first speed; and an input/output device which is connected between the semiconductor memory apparatus and the controller, and configured to control input/output of signals between the controller and the semiconductor memory apparatus, wherein the input/output device operates in a normal mode which corresponds to the input/output of the signals between the controller operating at the first speed and the semiconductor memory apparatus and a test mode which corresponds to the input/output of the signals between the controller operating at the second speed and the semiconductor memory apparatus.

In another exemplary aspect of the present invention, an input method of a semiconductor apparatus includes the steps of: applying n-bit data to n input terminals where n is an integer identical to or greater than 2; generating simultaneously first and second pulses in response to a test enable signal; receiving the n-bit data in response to the first and second pulses, and generating and latching n-bit first input latch data and n-bit second input latch data based on the n-bit data; and applying the n-bit first input latch data and the n-bit second input latch data to 2n output lines in response to an enable signal.

In another exemplary aspect of the present invention, an output method of a semiconductor apparatus includes the steps of: generating a first data group based on data applied to a plurality of input lines; generating a second data group to be the same as the first data group, based on the data applied to the plurality of input lines; outputting at least a portion of the first data group at a first timing; and outputting at least a portion of the second data group at a second timing after the first timing.

In another exemplary aspect of the present invention, an output circuit of a semiconductor apparatus includes: a select signal control unit configured to output a first select signal as a first input line select signal and a second select signal as a second input line select signal or output the first select signal as the second input line select signal and the second select signal as the first input line select signal, based on a test enable signal; a first multiplexer unit configured to output one half of data applied to input lines as first multiplexer data based on the first select signal and the second select signal; and a second multiplexer unit configured to output one half of the data applied to the input lines as second multiplexer data based on the first input line select signal and the second input line select signal.

In another exemplary aspect of the present invention, an input/output circuit of a semiconductor apparatus includes: an input block configured to receive in a normal mode 2n-bit input data in response to an external data strobe signal inputted at a first speed and generate a 2n-bit data group based on the 2n-bit input data, and receive in a test mode n-bit input data in response to the external data strobe signal inputted at a second speed and generate a 2n-bit data group based on the n-bit input data; an output block configured to output normal output data 2n times at the first speed in the normal mode, and output test output data n times at the second speed in the test mode; and a data strobe signal generation block configured to generate a data strobe signal which swings at the first speed, in the normal mode, and generate the data strobe signal which swings at the second speed, in the test mode, wherein n is an integer identical to or greater than 1.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
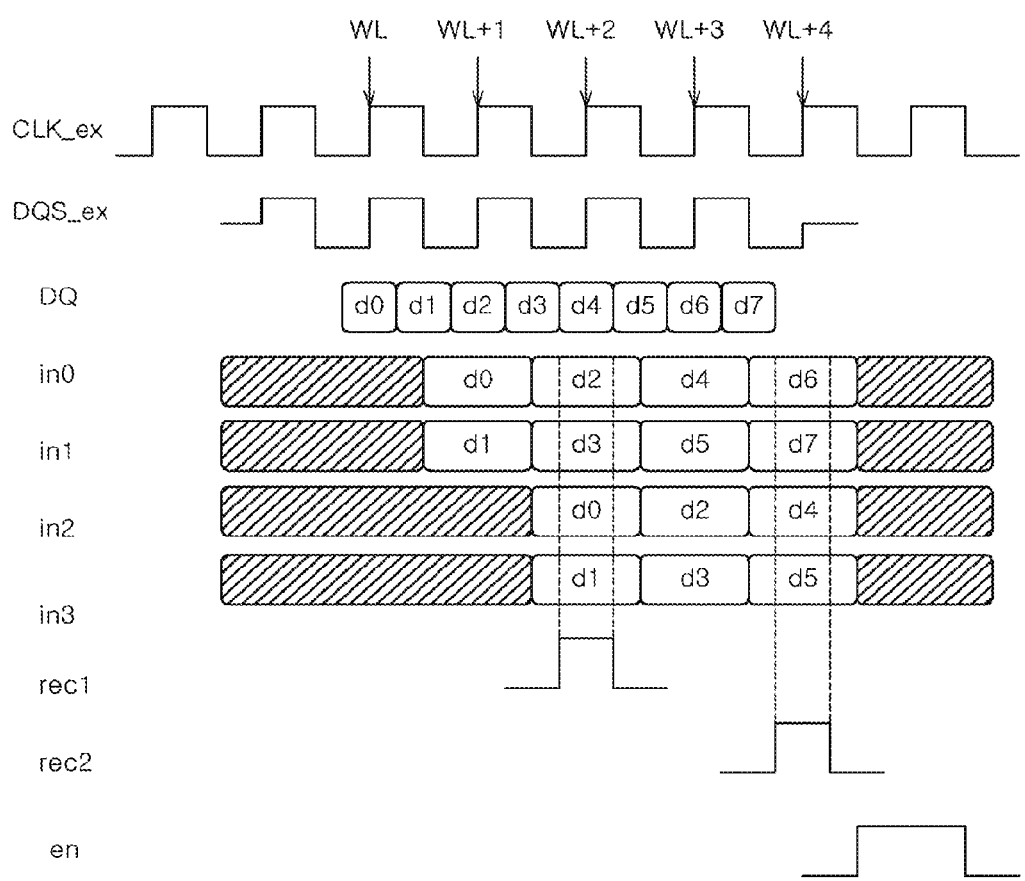
FIG. 1 is a timing diagram illustrating a case in which a high speed semiconductor apparatus in accordance with an embodiment of the present invention is loaded on a high speed test equipment and receives data.

Hereinafter, an input/output circuit and method of a semiconductor apparatus and a system with the same according to the present invention will be described below with reference to the accompanying drawings through exemplary embodiments.

Input/output circuits and methods of a semiconductor apparatus in accordance with an embodiment of the present invention solve the above-described problems, which are caused when a low speed test equipment loads a high speed semiconductor apparatus and performs tests for high speed operations, as stated below, so that the low speed test equipment can load the high speed semiconductor apparatus and perform the tests for high speed operations.

The input/output circuits and methods of the semiconductor apparatus in accordance with the embodiment of the present invention cause at least a portion of input/output signals to be inputted and outputted at a low speed between a test equipment and the semiconductor apparatus so that signals to be inputted and outputted at a high speed can be reduced, and causes the semiconductor apparatus receiving low speed signals to operate at a high speed. Accordingly, the input/output circuits and methods of the semiconductor apparatus in accordance with the embodiment of the present invention achieve advantageous effects in that a high speed semiconductor apparatus can be loaded and tested on a low speed test equipment.

The input/output circuits and methods of the semiconductor apparatus in accordance with the embodiment of the present invention receive an external clock at a high speed, or receive the external clock at a low speed and internally convert the external clock to have a high speed. As aforementioned above, the low speed test equipment outputs the external clock at a low speed. Accordingly, in order for the semiconductor apparatus in accordance with the embodiment of the present invention to receive the external clock at a high speed, it is necessary to modify the low speed test equipment. Since the modification of the low speed test equipment to ensure that the external clock can be outputted at a low speed and a high speed (for example, the external clock can be outputted while being decreased to one half in its cycle) can be easily implemented, detailed description thereof will be omitted.

The input/output circuits and methods of a semiconductor apparatus in accordance with the embodiment of the present invention can internally convert the external clock received at a low speed in such a way as to have a high speed. Such a setting can be implemented by configuring the semiconductor apparatus to include a clock divider such as a clock doubler circuit.

The input/output circuits and methods of the semiconductor apparatus in accordance with the embodiment of the present invention generate test data by an amount sufficient to perform a test at a high speed, based on the data inputted at a low speed from the low speed test equipment, such that the high speed semiconductor apparatus can be loaded and tested on the low speed test equipment. For example, in case when 8-bit test data are needed per unit time to perform a test at a high speed, the input/output circuits and methods of the semiconductor apparatus in accordance with the embodiment of the present invention receive at a low speed 4-bit test data per unit time and generates 8-bit test data based on the received 4-bit test data. This will be described below in detail with reference to FIG. 1.

FIG. 1 is a timing diagram illustrating a high speed semiconductor apparatus in accordance with an embodiment of the invention which is loaded on a high speed test equipment and receives data. FIG. 1 shows an external clock CLK_ex which is inputted at a high speed and an external data strobe signal DQS_ex which has the same cycle as the external clock CLK_ex. 8-bit data d0 through d7 are inputted in series to a data pad DQ in response to the rising edge and the falling edge of the external data strobe signal DQS_ex based on a write command WL. First data d0, third data d2, fifth data d4 and seventh data d6 are inputted in series to a first input terminal in0. At the same timing at which the data are inputted to the first input terminal in0, second data d1, fourth data d3, sixth data d5 and eighth data d7 are inputted in series to a second input terminal in1. The time necessary for which the respective bits of the 8-bit data d0 through d7 to be applied to the first and second input terminals in0 and in1 corresponds to one cycle of the external data strobe signal DQS_ex. The data applied to the first and second input terminals in0 and in1 are respectively applied to a third input terminal in2 and a fourth input terminal in4 while being delayed by one cycle of the clock signal CLK_ex. Next, the semiconductor apparatus simultaneously receives and latches the data applied to the first through fourth input terminals in0 through in3 in response to a first pulse rec1. The first through fourth data d0 through d3 are thus received and latched. Thereafter, the semiconductor apparatus simultaneously receives and latches the data applied to the first through fourth input terminals in0 through in3 in response to a second pulse rec2. The fifth through eighth data d4 through d7 are thus received and latched. The first through fourth data d0 through d3 received and latched in response to the first pulse rec1 are applied to first output lines (for example, first through fourth global input/output lines GIO0 through GIO3) in response to an enable signal en, and the fifth through eighth data d4 through d7 received and latched in response to the second pulse rec2 are applied to second output lines (for example, fifth through eighth global input/output lines GIO4 through GIO7) in response to the enable signal en. If the write command WL is activated and four cycles WL+4 of the external clock CLK_ex elapse, the data receiving method described above completes one cycle. Describing again the above operations, in the data receiving method of the semiconductor apparatus which is loaded on a high speed test equipment and receives data, by concatenating the four primary data d0 through d3 and the four secondary data d4 through d7 which are consecutively inputted to the four input terminals in0 through in3, the 8-bit data d0 through d7 are generated. Since the semiconductor apparatus uses the four input terminals in0 through in3 and receives the primary data d0 through d3 and the secondary data d4 through d7, the first pulse rec1 and the second pulse rec2 as signals for determining timings at which data are received from the four input terminals in0 through in3 are signals which are activated at different timings. As can be seen from FIG. 1, the first pulse rec1 and the second pulse rec2 are activated with an interval corresponding to two cycles of the external clock CLK_ex.

Figure 2:
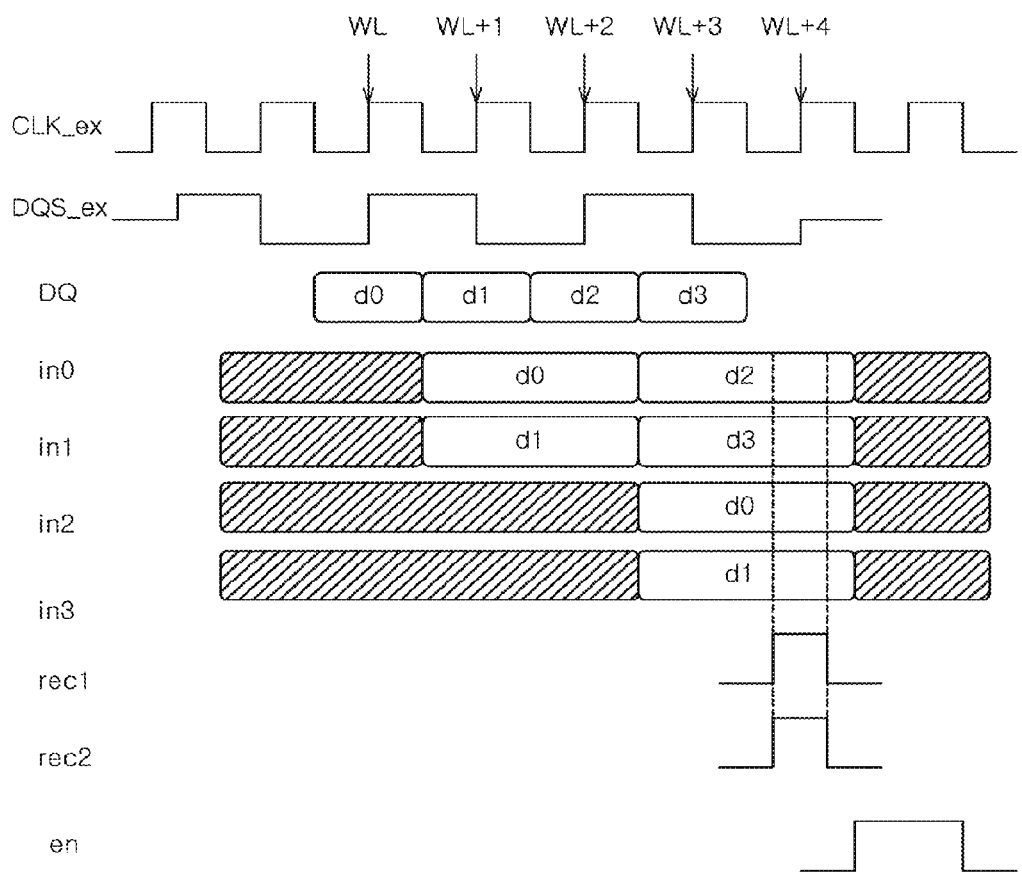
FIG. 2 is a timing diagram illustrating a case in which the high speed semiconductor apparatus in accordance with the embodiment of the present invention is loaded on a low speed test equipment and receives data.

FIG. 2 is a timing diagram illustrating the high speed semiconductor apparatus in accordance with the embodiment of the present invention which is loaded on a low speed test equipment and receives data. FIG. 2 shows an external clock CLK_ex which is inputted at a high speed. The high speed semiconductor apparatus receives an external data strobe signal DQS_ex from the low speed test equipment. In FIG. 2, the external data strobe signal DQS_ex has a cycle which corresponds to two times of the cycle of the external data strobe signal DQS_ex shown in FIG. 1. Since the external data strobe signal DQS_ex shown in FIG. 1 has the same cycle as the external clock CLK_ex, the external data strobe signal DQS_ex shown in FIG. 2 has the cycle which corresponds to two times of the external clock CLK_ex. 4-bit data d0 through d3 are inputted in series to a data pad DQ in response to the rising edge and the falling edge of the external data strobe signal DQS_ex based on a write command WL. Since FIG. 2 shows a timing diagram when the high speed semiconductor apparatus is loaded on the low speed test equipment, unlike the timing diagram of FIG. 1 in which the 8-bit data d0 through d7 are inputted to the data pad DQ, 4-bit data d0 through d3 are inputted to the data pad DQ in the timing diagram of FIG. 2. First data d0 and third data d2 are inputted in series to a first input terminal in0. At the same timing at which the data are inputted to the first input terminal in0, second data d1 and fourth data d3 are inputted in series to a second input terminal in1. The time necessary for which the respective bits of the 4-bit data d0 through d3 to be applied to the first and second input terminals in0 and in1 corresponds to one cycle of the external data strobe signal DQS_ex. The data applied to the first and second input terminals in0 and in1 are respectively applied to a third input terminal in2 and a fourth input terminal in4 while being delayed by one cycle of the clock signal CLK_ex. Next, the semiconductor apparatus simultaneously receives and latches the data applied to the first through fourth input terminals in0 through in3 in response to a first pulse rec1 and a second pulse rec2 which are simultaneously activated. The first through fourth data d0 through d3 are thus received and latched. The first through fourth data d0 through d3 which are received and latched in response to the first pulse rec1 are applied to first output lines (for example, first through fourth global input/output lines GIO0 through GIO3) in response to an enable signal en, and the first through fourth data d0 through d3 which are received and latched in response to the second pulse rec2 are applied to second output lines (for example, fifth through eighth global input/output lines GIO4 through GIO7) in response to the enable signal en. If the write command WL is activated and four cycles WL+4 of the external clock CLK_ex elapse, the data receiving method described above completes one cycle. Describing again the above operations, in the data receiving method of the semiconductor apparatus in accordance with the embodiment of the present invention, the 8-bit data d0 through d3 and d0 through d3 are generated based on the four primary data d0 through d3 which are inputted to the four input terminals in0 through in3. Because the 8-bit data d0 through d3 and d0 through d3 are generated by simultaneously receiving the primary data d0 through d3 inputted through the four input terminals in0 through in3, first pulse rec1 and the second pulse rec2 as signals for determining timings at which data are received from the four input terminals in0 through in3 are signals which are simultaneously activated. As can be seen from FIG. 2, the first pulse rec1 and the second pulse rec2 are simultaneously activated. The method for generating the 8-bit data d0 through d3 and d0 through d3 based on the four primary data d0 through d3 inputted to the four input terminals in0 through in3 may be implemented in a variety of different ways. Describing in detail, instead of generating the 8-bit data d0 through d3 and d0 through d3 by simply arranging twice the primary data d0 through d3 as described above, it can be envisaged that 8-bit data d0 through d3 and d0b through d3b can be generated by concatenating the primary data d0 through d3 and the inverted values d0b through d3b of the primary data d0 through d3. Otherwise, the 8-bit data, for example, d0, d1, d2, d3, d3, d1, d2 and d0, may be generated by concatenating the first data d0 through d3 through changing the sequence thereof. Moreover, the 8-bit data may be generated by re-concatenating the inverted values of the first data d0 through d3 and the data concatenated in the sequence thereof. Such a setting may be altered depending upon the desire of a designer, and it is to be noted that these examples of concatenating data are not intended to limit the scope of the present invention. The generation of the 8-bit data d0 through d3 and d0b through d3b by concatenating the primary data d0 through d3 and the inverted values d0b through d3b of the primary data d0 through d3 will be described later with reference to FIG. 6.

Figure 3:
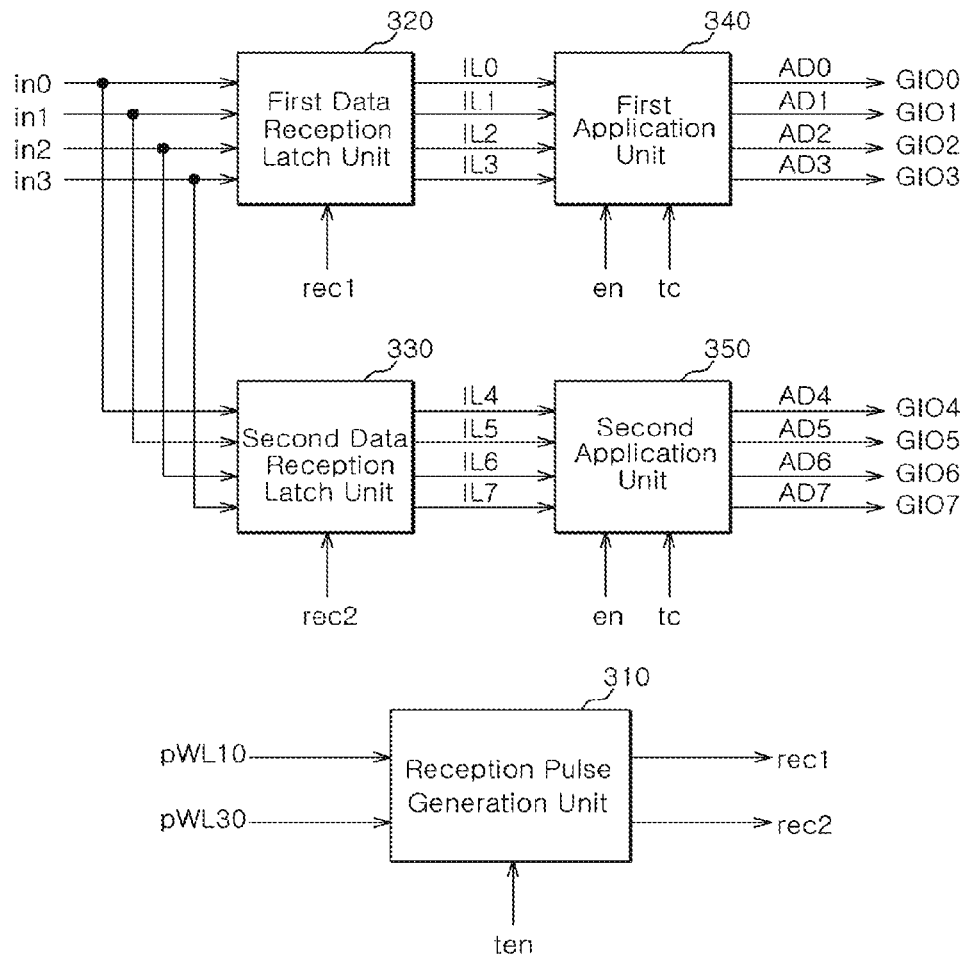
FIG. 3 is a schematic block diagram illustrating the semiconductor apparatus in accordance with the embodiment of the present invention, capable of performing data receiving methods shown in FIGS. 1 and 2.

FIG. 3 is a schematic block diagram illustrating the semiconductor apparatus in accordance with the embodiment of the present invention, which is capable of performing data receiving methods shown in FIGS. 1 and 2. The semiconductor apparatus is configured such that it can selectively use the data receiving methods described above with reference to FIGS. 1 and 2 in response to a test enable signal ten. The test enable signal ten is a signal which determines which one of the data receiving methods described above with reference to FIGS. 1 and 2 will be used by the semiconductor apparatus, and can be used by assigning a test mode signal which is inputted to the semiconductor apparatus.

Referring to FIG. 3, the semiconductor apparatus includes a reception pulse generation unit 310, a first data reception latch unit 320, a second data reception latch unit 330, a first application unit 340, and a second application unit 350.

The reception pulse generation unit 310 is configured to generate the first and second pulses rec1 and rec2 with a predetermined time interval or simultaneously generate the first and second pulses rec1 and rec2, in response to the test enable signal ten. The reception pulse generation unit 310 shown in FIG. 3 is configured in such a way as to receive first and second pulse source signals pWL10 and pWL30 which have different activation timings and output the first and second pulse source signals pWL10 and pWL30 as the first and second pulses rec1 and rec2 based on the test enable signal ten. The detailed configuration and the operation principle of the reception pulse generation unit 310 will be described later.

The first data reception latch unit 320 is configured to receive the serial data applied to a plurality of input terminals in response to the first pulse rec1 and latch the serial data as first input latch data. In FIG. 3, the plurality of input terminals are exemplified as input terminals in0 through in3, and the first input latch data are exemplified as four data IL0 through IL3.

The second data reception latch unit 330 is configured to receive the serial data applied to the four input terminals in0 through in3 in response to the second pulse rec2 and latch the serial data as second input latch data IL4 through IL7.

The first application unit 340 is configured to generate first application data AD0 through AD3 based on the first input latch data IL0 through IL3 and apply the first application data AD0 through AD3 to the first output lines GIO0 through GIO3 in response to the enable signal en.

The second application unit 350 is configured to generate second application data AD4 through AD7 based on the second input latch data IL4 through IL7 and apply the second application data AD4 through AD7 to the second output lines GIO4 through GIO7 in response to the enable signal en.

The semiconductor apparatus configured as shown in FIG. 3 receives data by using the data receiving method shown in FIG. 1 in case when the first and second pulses rec1 and rec2 are sequentially generated with the predetermined time interval based on the test enable signal ten, and receives the data by using the data receiving method shown in FIG. 2 in case when the first and second pulses rec1 and rec2 are simultaneously generated. Accordingly, when the reception pulse generation unit 310 generates the first pulse rec1 and the second pulse rec2 in such a way as to be simultaneously activated, the first input latch data IL0 through IL3 and the second input latch data IL4 through IL7 may have the same values respectively.

Figure 4:
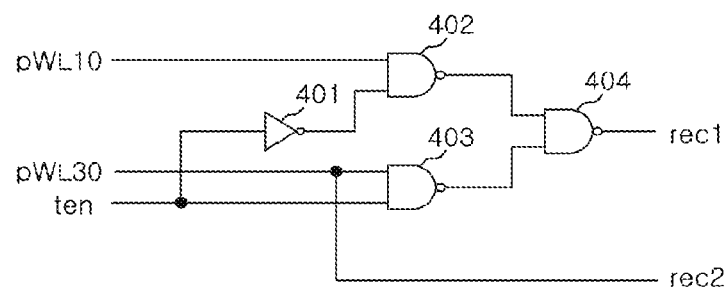
FIG. 4 is a circuit diagram illustrating an exemplary embodiment of the reception pulse generation unit shown in FIG. 3.

FIG. 4 is a circuit diagram illustrating an exemplary embodiment of the reception pulse generation unit 310 shown in FIG. 3.

The reception pulse generation unit 310 may be configured to include an inverter 401 and first through third NAND gates 402 through 404. The inverter 401 inverts the test enable signal ten. The first NAND gate 402 receives the first pulse source signal pWL10 and the output signal of the inverter 401 through the input terminal thereof. The second NAND gate 403 receives the second pulse source signal pWL30 and the test enable signal ten through the input terminal thereof. The third NAND gate 404 NANDs the signals outputted from the first NAND gate 402 and the second NAND gate 403 and outputs a NANDing result as the first pulse red. Also, the second pulse source signal pWL30 is outputted as the second pulse signal rec2. The first pulse source signal pWL10 and the second pulse source signal pWL30, as pulse signals sequentially generated when a preset time elapses after the write command WL is generated, become the sources of the first and second pulses rec1 and rec2. According to the configuration of the reception pulse generation unit 310 shown in FIG. 4, if the test enable signal ten is deactivated to a low level, the first pulse source signal pWL10 is outputted as the first pulse rec1, and the second pulse source signal pWL30 is outputted as the second pulse rec2. That is to say, the first and second pulses rec1 and rec2 are sequentially generated with the predetermined time interval. Conversely, if the test enable signal ten is activated to a high level, the second pulse source signal pWL30 is outputted as the first pulse rec1 and the second pulse rec2. That is to say, the first and second pulses rec1 and rec2 are simultaneously generated.

Figure 5:
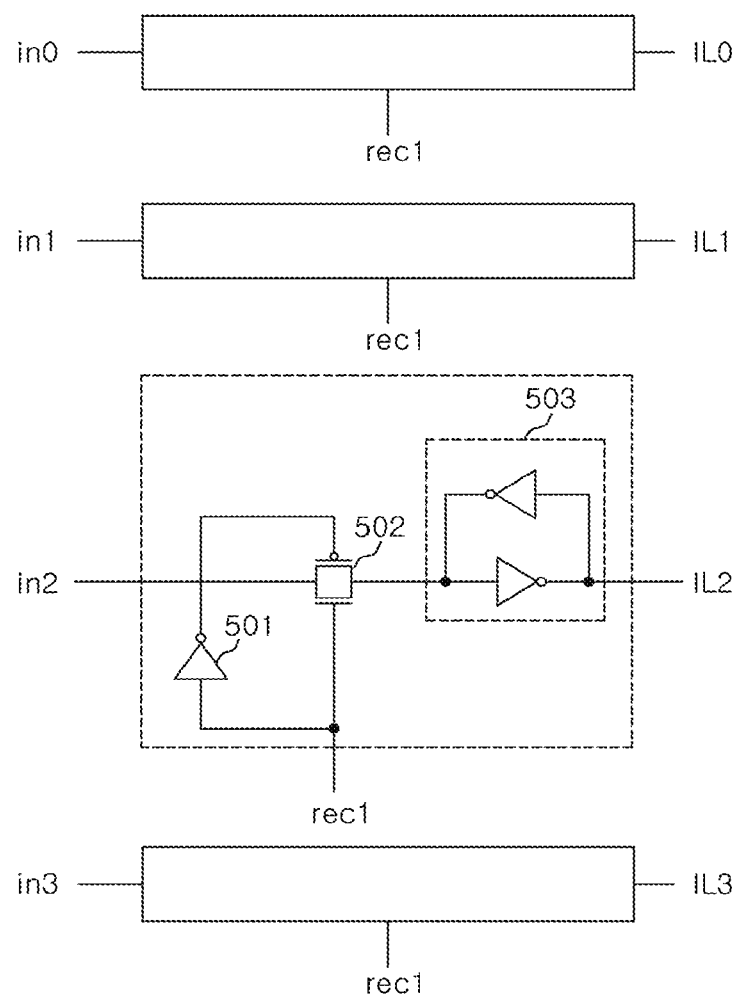
FIG. 5 is a circuit diagram illustrating an exemplary embodiment of the first data reception latch unit and the second data reception latch unit shown in FIG. 3.

FIG. 5 is a circuit diagram illustrating an exemplary embodiment of the first data reception latch unit 320 and the second data reception latch unit 330 shown in FIG. 3.

Each of the first data reception latch unit 320 and the second data reception latch unit 330 can include an inverter 501, a first pass gate 502 and a first latch 503. The circuit shown in FIG. 5 is a circuit which receives data from one input terminal (for example, the input terminal in2) and generates one input latch data (for example, the data IL2). In case when the first data reception latch unit 320 shown in FIG. 3 is configured to include the circuit shown in FIG. 5, the circuit shown in FIG. 5 may be provided in the number of four for respective input terminals in0 through in3. For the sake of convenience in explanation, it is assumed that the circuit shown in FIG. 5 constitutes a portion of the first data reception latch unit 320, which receives data from the third input terminal in2 and generates the third data IL2 of the first input latch data. The inverter 501 inverts the first pulse red. The first pass gate 502 receives the first pulse rec1 and the output value of the inverter 501 through the NMOS input terminal and the PMOS input terminal thereof, and is activated and deactivated based on the first pulse red. The input terminal of the first pass gate 502 is coupled with the third input terminal in2, and the output terminal of the first pass gate 502 is coupled with the first latch 503. The first latch 503 latches the data inputted from the first pass gate 502 as the third data IL2 of the first input latch data. According to the configuration shown in FIG. 5, the first data reception latch unit 320 performs operations of receiving the data applied to the third input terminal in2 at a timing at which the first pulse rec1 is activated and latching the received data as the third data IL2 of the first input latch data. The second data reception latch unit 330 may be configured in the same way as the first data reception latch unit 320 shown in FIG. 5 except the input/output of signals, and may operate in the same manner as the first data reception latch unit 320. Therefore, detailed descriptions thereof will be omitted herein.

Figure 6:
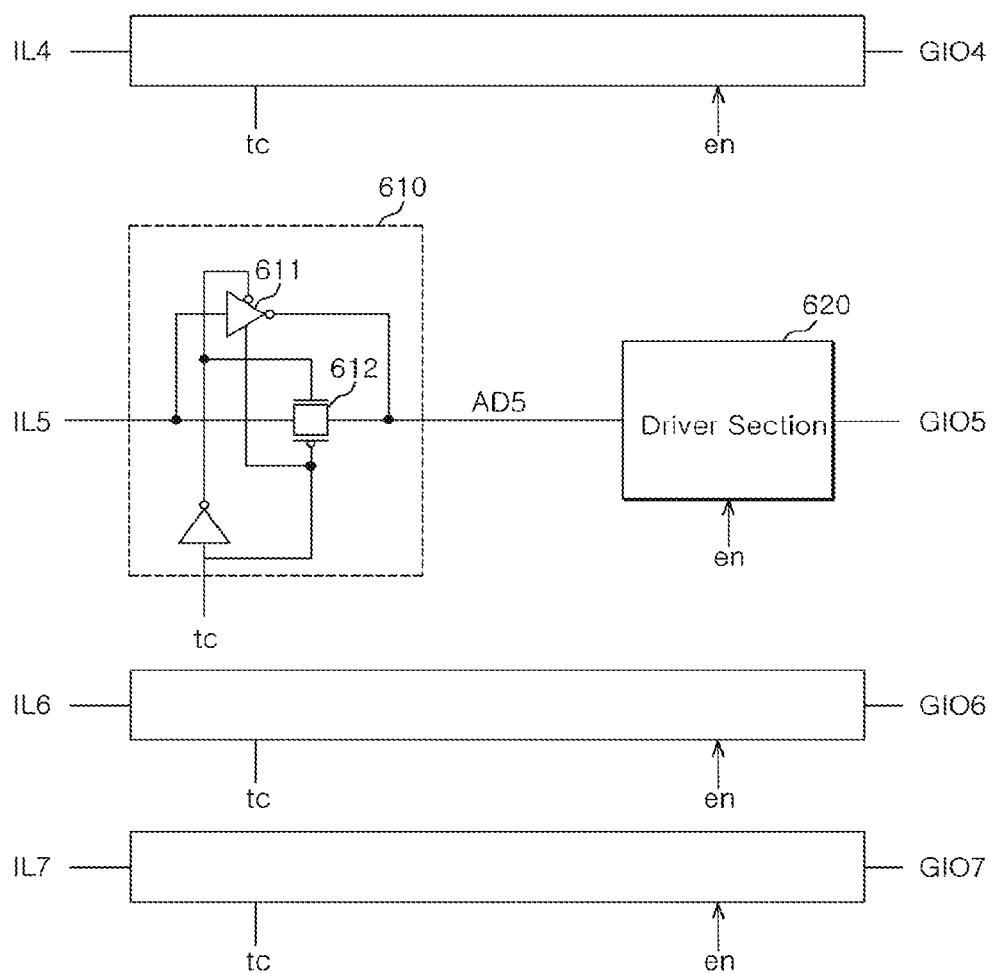
FIG. 6 is a circuit diagram illustrating an exemplary embodiment of the first application unit and the second application unit shown in FIG. 3.

FIG. 6 is a circuit diagram illustrating an exemplary embodiment of the first application unit 340 and the second application unit 350 shown in FIG. 3. Hereinbelow, descriptions will be given based on the second application unit 350.

The second application unit 350 may be configured to include a data processing section 610 and a driver section 620.

The data processing section 610 is configured to receive each of the second input latch data IL4 through IL7, invert each of the second input latch data IL4 through IL7 based on a test control signal tc, and output each of the second application data AD4 through AD7. In the second application unit 350 shown in FIG. 6, the test control signal tc as a signal for controlling the second application data AD4 through AD7 may be used by assigning a test mode signal which is inputted to the semiconductor apparatus.

The circuit shown in FIG. 6 is a circuit which receives one of the second input latch data (for example, the data IL5), generates one of the second application data (for example, the data AD5), and applies the one second application data AD5 to one second output line (for example, the line GIO5). In case when the second application unit 350 is configured to include the circuit shown in FIG. 6, the circuit shown in FIG. 6 may be provided in the number of four for the respective second input latch data IL4 through IL7. For the sake of convenience in explanation, it is assumed that the circuit shown in FIG. 6 constitutes a portion of the second application unit 350 which receives the second input latch data IL5, generates the second application data AD5 and applies the second application data AD5 to the second output line GIO5.

Referring to FIG. 6, the data processing section 610 may be configured to include a tri-state inverter 611 and a pass gate 612. The tri-state inverter 611 is configured to be activated by the test control signal tc and the inverted signal of the test control signal tc. If the tri-state inverter 611 is activated by the test control signal tc, the tri-state inverter 611 receives the second input latch data IL5 through the input terminal thereof, inverts the second input latch data IL5 and outputs the second input latch data IL5. The pass gate 612 is configured to be activated by the test control signal tc and the inverted signal of the test control signal tc. If the pass gate 612 is activated by the test control signal tc, the pass gate 612 receives the second input latch data IL5 through the input terminal thereof and outputs the second input latch data IL5. The output terminals of the tri-state inverter 611 and the pass gate 612 are coupled with each other, and the second application data AD5 is outputted through the output terminals of the tri-state inverter 611 and the pass gate 612. The tri-state inverter 611 and the pass gate 612 have different activation durations. Describing in detail, if the test control signal tc is activated to a high level, the pass gate 612 is deactivated, and the tri-state inverter 611 is activated. Conversely, if the test control signal tc is deactivated to a low level, the pass gate 612 is activated, and the tri-state inverter 611 is deactivated. According to this configuration, if the test control signal tc is activated to the high level, the data processing section 610 inverts the second input latch data IL5 and generates the second application data AD5. Conversely, if the test control signal tc is deactivated to the low level, the data processing section 610 does not invert the second input latch data IL5 and generates the second application data AD5.

The driver section 620 is configured to apply the second application data AD5 outputted from the data processing section 610 to the second output line GIO5 in response to the enable signal en. The driver section 620 may be configured to include a general driver circuit which is activated in response to the enable signal en.

When the second application unit 350 is configured to include the data processing section 610 and the driver section 620 as shown in FIG. 6, it is possible to control the data applied to the second output lines GIO4 through GIO7 to become the second input latch data IL4 through IL7 or the inverted data of the second input latch data IL4 through IL7. Through this, it is possible to make the data applied to the second output lines GIO4 through GIO7 be the inverted values of the data applied to the four input terminals in0 through in3. However, such inversion operations may not be necessarily performed in the second application unit 350 shown in FIG. 6. The inversion operations may be performed in the second data reception latch unit 330. The second data reception latch unit 330 receives the serial data applied to the four input terminals in0 through in3 in response to the second pulse rec2 and latches the serial data as the second input latch data IL4 through IL7. In this regard, in case when the second data reception latch unit 330 is configured to invert the data inputted from the four input terminals in0 through in4 and latch the inputted data as the second input latch data IL4 through IL7, it is possible to make the data applied to the second output lines GIO4 through GIO7 be the inverted values of the data applied to the four input terminals in0 through in4 in the same manner as in the inversion operation of the second application unit 350 shown in FIG. 6. Since the second data reception latch unit 330 which performs the inversion operations can be easily configured by additionally including tri-state inverters receiving the test control signal tc and pass gates in the circuit according to the exemplary embodiment of the second data reception latch unit 330 shown in FIG. 5, detailed descriptions thereof will be omitted herein.

The first application unit 340 may be configured in the same way as the second application unit 350 shown in FIG. 6 except the input/output of signals and operate in the same manner as the second application unit 350. Therefore, detailed descriptions thereof will be omitted herein.

The function of controlling the data applied to the first output lines GIO0 through GIO3 and the second output lines GIO4 through GIO7 in response to the test control signal tc is exemplified as a data combination type in one embodiment, and may not be necessarily included in embodying the present invention. Depending upon the desire of a designer, each of the first application unit 340 and the second application unit 350 may be configured not to include the data processing section 610 and only include the data driver 620.

According to the aforementioned embodiments, the semiconductor apparatus in accordance with the embodiment of the present invention mentioned above with reference to FIGS. 1 through 6 can be loaded on both a high speed test equipment which inputs data at a high speed to a semiconductor apparatus and a low speed test equipment which inputs data at a low speed to a semiconductor apparatus, so that tests can be performed.

The high speed semiconductor apparatus in accordance with the embodiment of the present invention can output data at a high speed to the high speed test equipment when it is loaded on the high speed test equipment, and can output data at a low speed to the low speed test equipment when it is loaded on the low speed test equipment. In this way, the high speed semiconductor apparatus in accordance with the embodiment of the present invention can be loaded on both the high speed and low speed test equipments so that tests can be performed. The control of speeds at which the high speed semiconductor apparatus outputs data may be implemented as in the following methods.

Figure 7:
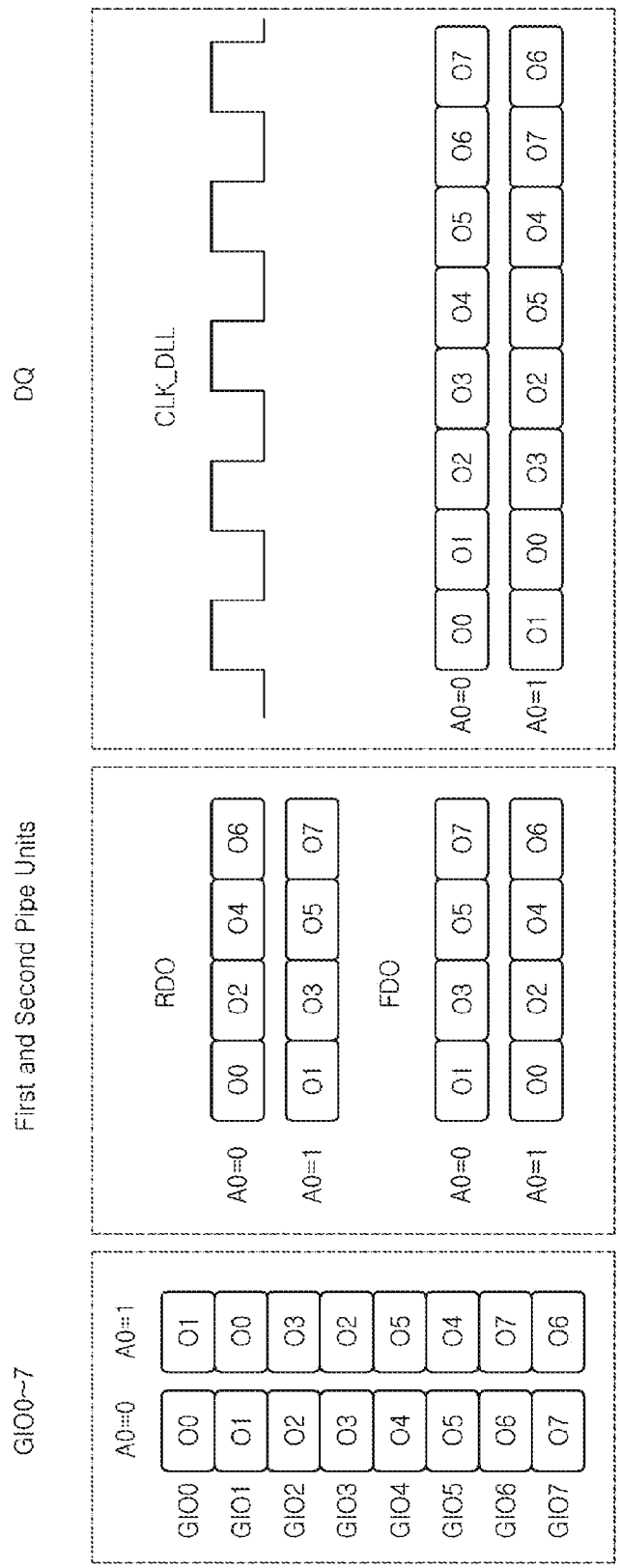
FIG. 7 is a timing diagram illustrating a high speed data output method in the semiconductor apparatus in accordance with the embodiment of the present invention.
Figure 8:
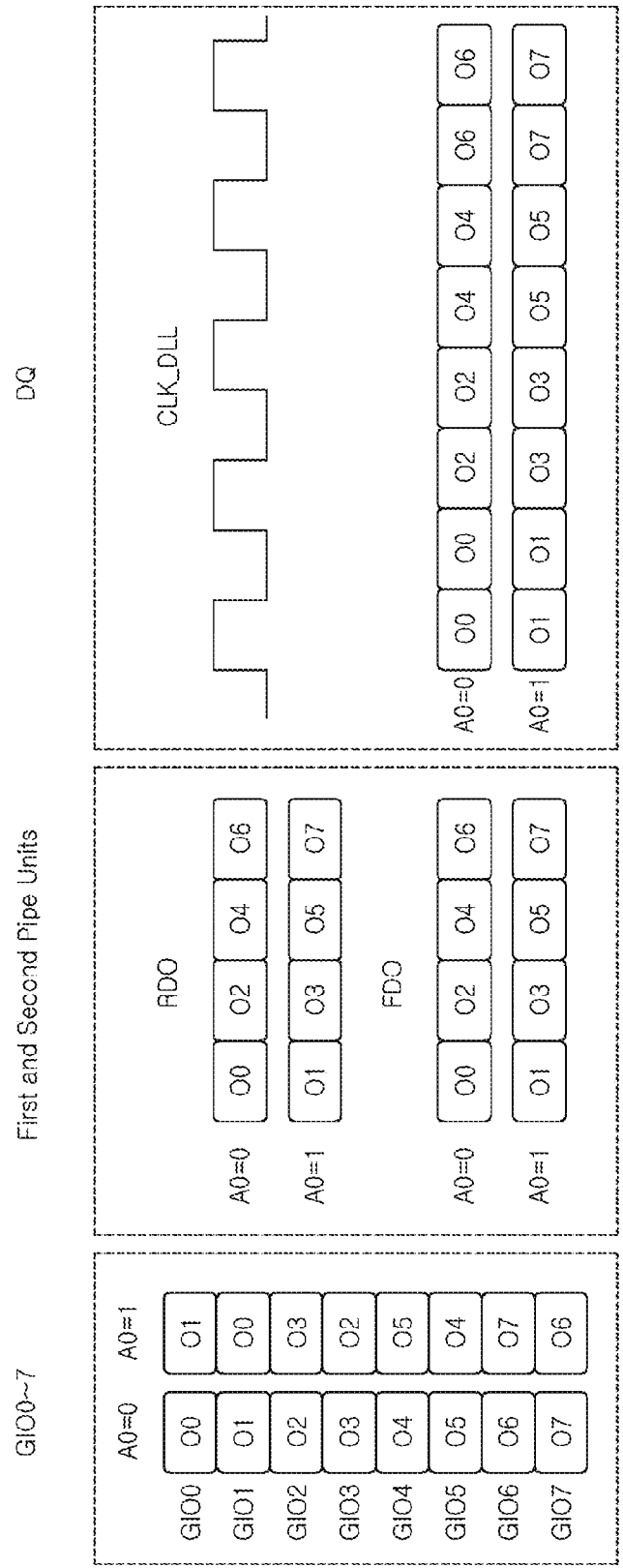
FIG. 8 is a timing diagram illustrating a low speed data output method in the semiconductor apparatus in accordance with the embodiment of the present invention.

FIG. 7 is a timing diagram illustrating a high speed data output method in the semiconductor apparatus in accordance with the embodiment of the present invention, and FIG. 8 is a timing diagram illustrating a low speed data output method in the semiconductor apparatus in accordance with the embodiment of the present invention.

FIG. 7 shows a state in which first through eighth data O0 through O7 are inputted to eight input lines GIO0 through GIO7. The sequence of the first through eighth input data O0 through O7 applied to the eight input lines GIO0 through GIO7 changes depending upon a seed address. The seed address is the value of a specified bit of an address. Depending upon the value of the seed address, the sequence of the first through eighth input data O0 through O7 applied to the eight input lines GIO0 through GIO7 changes, and accordingly, the sequence of the data outputted to the data pad DQ changes. In general, a seed address uses the first bit of an address. As shown in FIG. 7, when the seed address A0 is 0, the eight input data O0 through O7 are applied to the eight input lines GIO0 through GIO7 by respectively corresponding as O0, O1, O2, O3, O4, O5, O6 and O7, and when the seed address A0 is 1, the eight input data O0 through O7 are applied to the eight input lines GIO0 through GIO7 by respectively corresponding as O1, O0, O3, O2, O5, O4, O7 and O6. Therefore, when the seed address A0 is 0, the eight input data O0 through O7 are outputted to the data pad DQ in the sequence of O0, O1, O2, O3, O4, O5, O6 and O7, and when the seed address A0 is 1, the eight input data O0 through O7 are outputted to the data pad DQ in the sequence of O1, O0, O3, O2, O5, O4, O7 and O6. For the sake of convenience in explanation, the timing diagrams of FIGS. 7 and 8, illustrating the high and low speed data output methods in the semiconductor apparatus in accordance with the embodiment of the present invention, will be explained for the case in which the seed address A0 is 0.

Referring to FIG. 7, it is shown that the first through eighth input data O0 through O7 are applied to the eight input lines GIO0 through GIO7 by respectively corresponding as O0, O1, O2, O3, O4, O5, O6 and O7.

Next, the data O0, O2, O4 and O6 applied to the odd input lines GIO0, GIO2, GIO4 and GIO6 of the eight input lines GIO0 through GIO7 are selected as a first data group RDO, and the data O1, O3, O5 and O7 applied to the even input lines GIO1, GIO3, GIO5 and GIO7 of the eight input lines GIO0 through GIO7 are selected as a second data group FDO.

In response to an input clock CLK_DLL shown in FIG. 7, the first data O0 of the first data group RDO is outputted at the rising edge of the input clock CLK_DLL, and the first data O1 of the second data group FDO is outputted at the falling edge of the input clock CLK_DLL. In this way, as the input clock CLK_DLL swings between high and low levels, the data of the first data group RDO and the second data group FDO are outputted in series as shown in FIG. 7. The input clock CLK_DLL has the same cycle as the external clock CLK_ex. Referring to FIG. 7, since the data of the first data group RDO: O0, O2, O4 and O6 and the second data group FDO: O1, O3, O5 and O7 which have different data values are consecutively outputted as the input clock CLK_DLL swings, the method shown in FIG. 7 is appropriate for a case in which the high speed semiconductor apparatus is loaded on a high speed test equipment and outputs data at a high speed. In the present embodiment, the input clock CLK_DLL may be realized using a DLL clock which controls an output timing.

Referring to FIG. 8, similar to FIG. 7, it is shown that the first through eighth input data O0 through O7 are applied to the eight input lines GIO0 through GIO7 by respectively corresponding as O0, O1, O2, O3, O4, O5, O6 and O7.

Next, the data O0, O2, O4 and O6 applied to the odd input lines GIO0, GIO2, GIO4 and GIO6 of the eight input lines GIO0 through GIO7 are selected as a first data group RDO, and the same data as the first data group RDO, that is, the data O0, O2, O4 and O6 applied to the odd input lines GIO0, GIO2, GIO4 and GIO6 of the eight input lines GIO0 through GIO7 are selected as a second data group FDO.

In response to an input clock CLK_DLL, the first data O0 of the first data group RDO is outputted at the rising edge of the input clock CLK_DLL, and the first data O0 of the second data group FDO is outputted at the falling edge of the input clock CLK_DLL. Namely, the same data are continuously outputted twice at the rising edge and the falling edge of the input clock CLK_DLL. The data of the first data group RDO and the second data group FDO are sequentially outputted as the input clock CLK_DLL swings between high and low levels. Due to this data output scheme, as can be seen from FIG. 8, as the same data are continuously outputted twice, the same data are maintained during one cycle of the input clock CLK_DLL. Referring to the output waveform shown in FIG. 8, unlike the output waveform of FIG. 7 in which one data, for example, O0, is outputted every one half cycle of the input clock CLK_DLL, one data, for example, O0, is outputted every one cycle of the input clock CLK_DLL. Accordingly, the method shown in FIG. 8 is appropriate for a case in which the high speed semiconductor apparatus is loaded on a low speed test equipment and outputs data at a low speed. Referring to FIG. 8, because the first data group RDO and the second data group FDO have the same data O0, O2, O4 and O6, the data outputted to the data pad DQ correspond to one half of the data applied to the eight input lines GIO0 through GIO7. Therefore, in order to output the entirety of the data O0 through O7 applied to the eight input lines GIO0 through GIO7, the output method shown in FIG. 8 should be implemented twice. Describing in detail, as can be seen from FIG. 8, by making a setting such that the odd data O0, O2, O4 and O6 among the data applied to the eight input lines GIO0 through GIO7 are selectively outputted as the first and second data groups RDO and FDO in a first cycle and the even data O1, O3, O5 and O7 among the data applied to the eight input lines GIO0 through GIO7 are selectively outputted as the first and second data groups RDO and FDO in a second cycle, the entirety of the data O0 through O7 applied to the eight input lines GIO0 through GIO7 can be outputted. Distinguishment of these cycles becomes possible by changing the seed address. For example, as shown in FIG. 8, a method can be used, wherein, if the first bit A0 of the address corresponding to the data applied to the eight input lines GIO0 through GIO7, that is, the seed address is 0, the data O0, O2, O4 and O6 may be selected as the first and second data groups RDO and FDO, and if the seed address is 1, the data O1, O3, O5 and O7 may be selected as the first and second data groups RDO and FDO. As shown in FIG. 8, by executing the cycle twice by setting the value of the seed address as 1 and 0, the entire eight input data O0 through O7 can be outputted.

In the descriptions of FIGS. 7 and 8, the data of the first data group RDO and the second data group FDO are outputted in response to the rising edge and the falling edge of the input clock CLK_DLL. Such a setting is presented as an exemplary embodiment, and it is to be readily understood that the data of the first data group RDO and the second data group FDO can be consecutively outputted in response to alternately activated timings. Hence, it is to be noted that the exemplary embodiment in which the input clock CLK_DLL and the rising edge and the falling edge of the input clock CLK_DLL are adopted is not intended to limit features essential to the realization of the invention.

Figure 9:
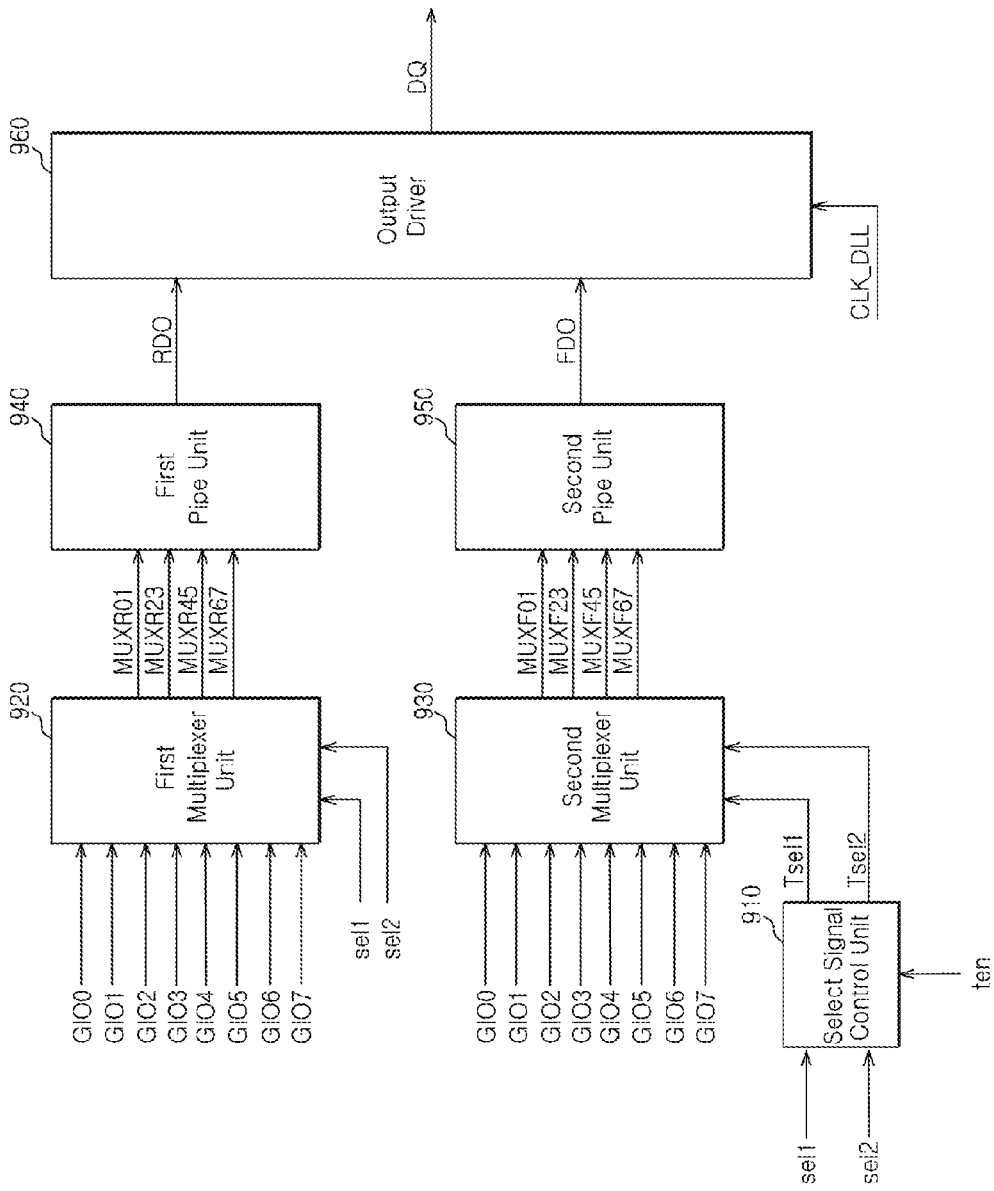
FIG. 9 is a schematic block diagram illustrating an output circuit of a semiconductor apparatus in accordance with another embodiment of the present invention.

FIG. 9 is a schematic block diagram illustrating an output circuit of a semiconductor apparatus in accordance with another embodiment of the present invention. The data output circuit is configured in such manner that one of the high speed and low speed data output methods shown in FIGS. 7 and 8 can be implemented based on the test enable signal ten.

The data output circuit may be configured to include a select signal control unit 910, a first multiplexer unit 920, a second multiplexer unit 930, a first pipe unit 940, a second pipe unit 950, and an output driver 960.

The select signal control unit 910 is configured to output a first select signal sel1 and a second select signal sel2 as a first input line select signal Tsel1 and a second input line select signal Tsel2, respectively, based on the test enable signal ten, or output the second select signal sel2 and the first select signal sel1 as the first input line select signal Tsel1 and the second input line select signal Tsel2, respectively, based on the test enable signal ten.

The first multiplexer unit 920 is configured to output the data applied to one half of eight input lines GIO0 through GIO7 as first multiplexer data MUXR based on the first select signal sel1 and the second select signal sel2. For example, in the case of the methods shown in FIGS. 7 and 8, if the first select signal sel1 is activated, the first multiplexer unit 920 selects odd data O0, O2, O4 and O6 among eight input data O0 through O7 applied to the eight input lines GIO0 through GIO7 and outputs the first multiplexer data MUXR. Also, if the second select signal sel2 is activated, the first multiplexer unit 920 selects even data O1, O3, O5 and O7 among the eight input data O0 through O7 applied to the eight input lines GIO0 through GIO7 and outputs the first multiplexer data MUXR. The first multiplexer data MUXR are a plurality of parallel data, and in FIG. 9, it is illustrated that the first multiplexer data MUXR are presented as four parallel data MUXR01, MUXR23, MUXR45 and MUXR67 constituted by selecting four of the eight input data O0 through O7 applied to the eight input lines GIO0 through GIO7.

The second multiplexer unit 930 is configured to output the data applied to one half of the eight input lines GIO0 through GIO7 as second multiplexer data MUXF based on the first input line select signal Tsel1 and the second input line select signal Tsel2. For example, in the case of the methods shown in FIGS. 7 and 8, if the first input line select signal Tsel1 is activated, the second multiplexer unit 930 selects the odd data O0, O2, O4 and O6 among the eight input data O0 through O7 applied to the eight input lines GIO0 through GIO7 and outputs the second multiplexer data MUXF. Also, if the second input line select signal Tsel2 is activated, the second multiplexer unit 930 selects the even data O1, O3, O5 and O7 among the eight input data O0 through O7 applied to the eight input lines GIO0 through GIO7 and outputs the second multiplexer data MUXF. The second multiplexer data MUXF are a plurality of parallel data, and in FIG. 9, it is illustrated that the second multiplexer data MUXF are presented as four parallel data MUXF01, MUXF23, MUXF45 and MUXF67 constituted by selecting four of the eight input data O0 through O7 applied to the eight input lines GIO0 through GIO7.

The first pipe unit 940 is configured to receive the first multiplexer data MUXR in parallel, and generate and output the first data group RDO in series. The first pipe unit 940 may be configured to include a plurality of latch circuits.

The second pipe unit 950 is configured to receive the second multiplexer data MUXF in parallel, and generate and output the second data group FDO in series. The second pipe unit 950 may be configured to include a plurality of latch circuits.

The output driver 960 is configured to alternately output the first data group RDO and the second data group FDO to the data pad DQ in response to the input clock CLK_DLL. The output driver 960 may be configured to include a general output buffer.

The first data group RDO and the second data group FDO which are outputted from the data output circuit shown in FIG. 9 may have the same value or different values in response to the test enable signal ten. For example, if the test enable signal ten is deactivated, as shown in FIG. 7, the first data group RDO may be the odd data O0, O2, O4 and O6 among the eight input data O0 through O7 applied to the eight input lines GIO0 through GIO7, and the second data group FDO may be the even data O1, O3, O5 and O7 among the eight input data O0 through O7 applied to the eight input lines GIO0 through GIO7. Conversely, if the test enable signal ten is activated, as shown in FIG. 8, both the first data group RDO and the second data group FDO may be the odd data O0, O2, O4 and O6 among the eight input data O0 through O7 applied to the eight input lines GIO0 through GIO7, otherwise both the first data group RDO and the second data group FDO may be the even data O1, O3, O5 and O7 among the eight input data O0 through O7 applied to the eight input lines GIO0 through GIO7. The first data group RDO and the second data group FDO are inputted to the output driver 960 and are alternately outputted to the data pad DQ. For example, the output driver 960 may repeat a procedure in response to the input clock CLK_DLL, in which the first data of the first data group RDO is outputted at the rising edge of the input clock CLK_DLL, the first data of the second data group FDO is outputted at the falling edge of the input clock CLK_DLL, next data of the first data group RDO is outputted at next rising edge of the input clock CLK_DLL, and next data of the second data group FDO is outputted at next falling edge of the input clock CLK_DLL.

Figure 10:
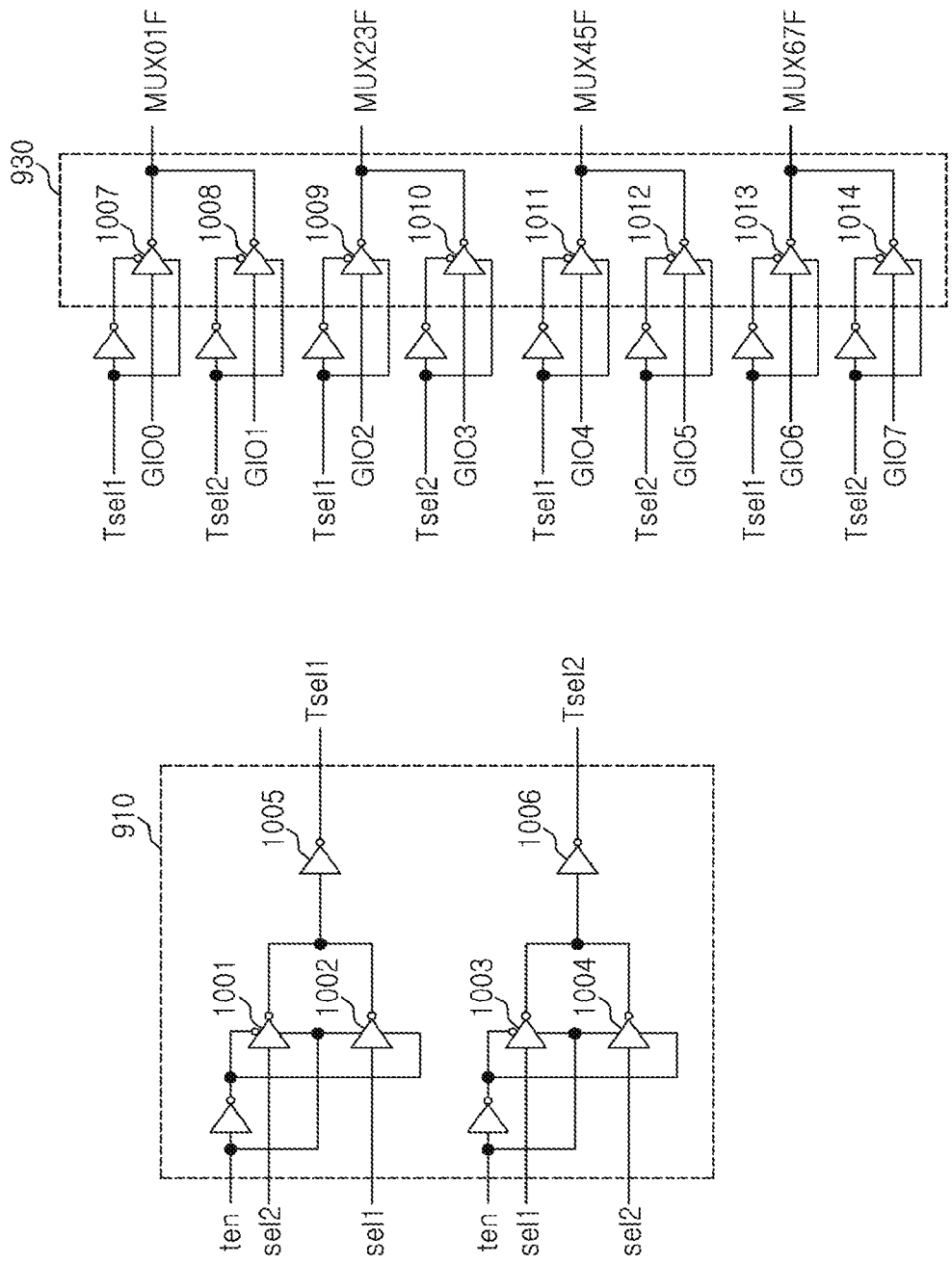
FIG. 10 is a detailed circuit diagram illustrating exemplary embodiments of the select signal control unit and the second multiplexer unit shown in FIG. 9.

FIG. 10 is a detailed circuit diagram illustrating exemplary embodiments of the select signal control unit 910 and the second multiplexer unit 930 shown in FIG. 9.

As described above, the select signal control unit 910 is configured to output the first select signal sel1 and the second select signal sel2 as the first input line select signal Tsel1 and the second input line select signal Tsel2, respectively, based on the test enable signal ten, or output the second select signal sel2 and the first select signal sel1 as the first input line select signal Tsel1 and the second input line select signal Tsel2, respectively, based on the test enable signal ten. The select signal control unit 910 may be configured to include first through fourth tri-state inverters 1001 through 1004 and first and second inverters 1005 and 1006. The first tri-state inverter 1001 is activated when the test enable signal ten is deactivated, and inverts and outputs the second select signal sel2. The second tri-state inverter 1002 is activated when the test enable signal ten is activated, and inverts and outputs the first select signal sel1. The first inverter 1005 inverts the output values of the first tri-state inverter 1001 and the second tri-state inverter 1002 and outputs the first input line select signal Tsel1. Since one of the first tri-state inverter 1001 and the second tri-state inverter 1002 is activated depending upon the test enable signal ten, collision of logic values does not occur at the input terminal of the first inverter 1005. The third tri-state inverter 1003 is activated when the test enable signal ten is deactivated, and inverts and outputs the first select signal sel1. The fourth tri-state inverter 1004 is activated when the test enable signal ten is activated, and inverts and outputs the second select signal sel2. The second inverter 1006 inverts the output values of the third tri-state inverter 1003 and the fourth tri-state inverter 1004 and outputs the second input line select signal Tsel2.

The second multiplexer unit 930 may be configured to include fifth through twelfth tri-state inverters 1007 through 1014. The input terminals of the eight tri-state inverters 1007 through 1014 are respectively coupled to the eight input lines GIO0 through GIO7. The fifth, seventh, ninth and eleventh tri-state inverters 1007, 1009, 1011 and 1013 are activated in response to the first input line select line Tsel1, and the sixth, eighth, tenth and twelfth tri-state inverters 1008, 1010, 1012 and 1014 are activated in response to the second input line select signal Tsel2. The output terminals of the fifth and sixth tri-state inverters 1007 and 1008 are coupled with each other, and the first bit MUXF01 of the second multiplexer data MUXF is outputted through the output terminals. The output terminals of the seventh and eighth tri-state inverters 1009 and 1010 are coupled with each other, and the second bit MUXF23 of the second multiplexer data MUXF is outputted through the output terminals. The output terminals of the ninth and tenth tri-state inverters 1011 and 1012 are coupled with each other, and the third bit MUXF45 of the second multiplexer data MUXF is outputted through the output terminals. The output terminals of the eleventh and twelfth tri-state inverters 1013 and 1014 are coupled with each other, and the fourth bit MUXF67 of the second multiplexer data MUXF is outputted through the output terminals.

Figure 11B:
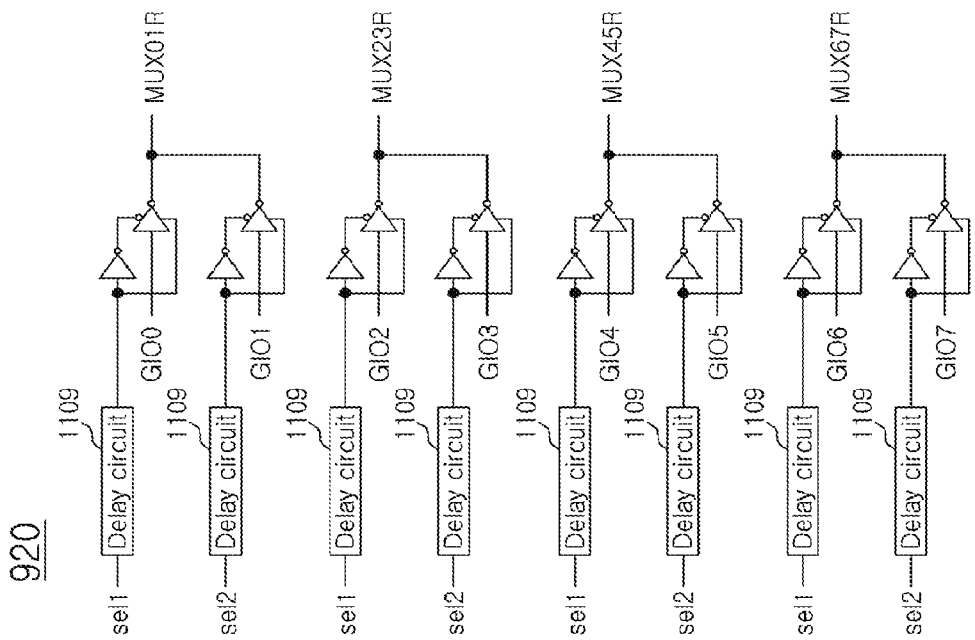
FIG. 11b is a detailed circuit diagram illustrating another exemplary embodiment of the first multiplexer unit shown in FIG. 9.
Figure 11A:
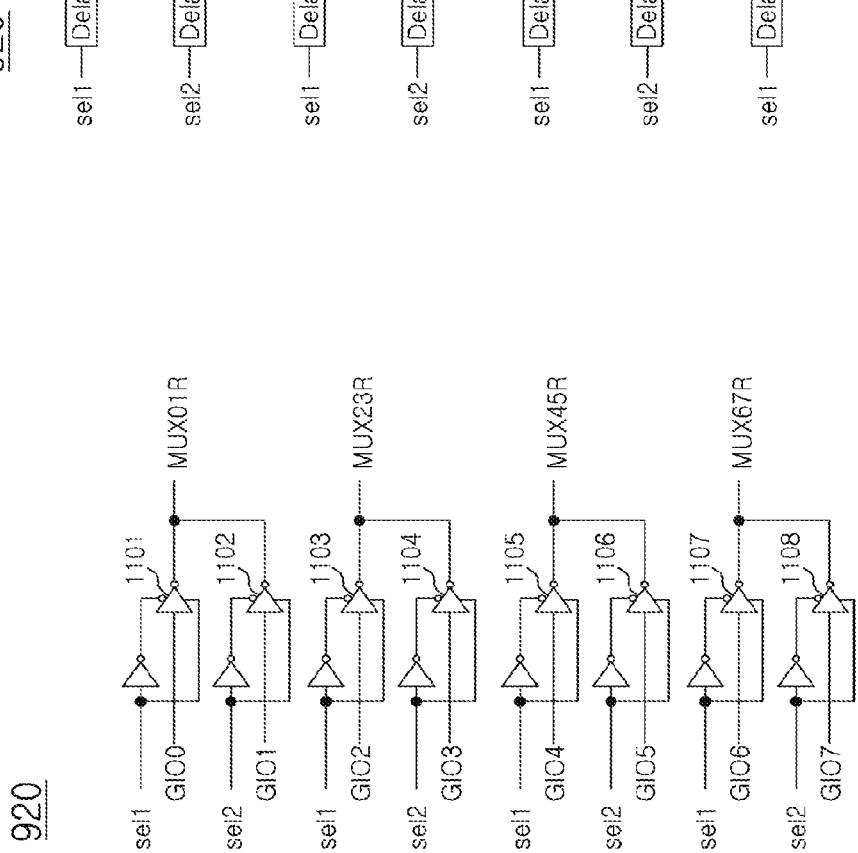
FIG. 11a is a detailed circuit diagram illustrating an exemplary embodiment of the first multiplexer unit shown in FIG. 9.

FIG. 11a is a detailed circuit diagram illustrating an exemplary embodiment of the first multiplexer unit 920 shown in FIG. 9.

The first multiplexer unit 920 may be configured to include first through eighth tri-state inverters 1101 through 1108. The input terminals of the eight tri-state inverters 1101 through 1108 are respectively coupled to the eight input lines GIO0 through GIO7. The first, third, fifth and seventh tri-state inverters 1101, 1103, 1105 and 1107 are activated in response to the first select signal sel1, and the second, fourth, sixth and eighth tri-state inverters 1102, 1104, 1106 and 1108 are activated in response to the second select signal sel2. The output terminals of the first and second tri-state inverters 1101 and 1102 are coupled with each other, and the first bit MUXR01 of the first multiplexer data MUXR is outputted through the output terminals. The output terminals of the third and fourth tri-state inverters 1103 and 1104 are coupled with each other, and the second bit MUXR23 of the first multiplexer data MUXR is outputted through the output terminals. The output terminals of the fifth and sixth tri-state inverters 1105 and 1106 are coupled with each other, and the third bit MUXR45 of the first multiplexer data MUXR is outputted through the output terminals. The output terminals of the seventh and eighth tri-state inverters 1107 and 1108 are coupled with each other, and the fourth bit MUXR67 of the first multiplexer data MUXR is outputted through the output terminals.

According to the configurations of the select signal control unit 910, the first multiplexer unit 920 and the second multiplexer unit 930 shown in FIGS. 10 and 11a, the data output circuit operates as follows, in response to the test enable signal ten, the first select signal sel1 and the second select signal sel2. For the sake of convenience in explanation, it is assumed that the eight input data O0 through O7 applied to the eight input lines GIO0 through GIO7 are applied by respectively corresponding as O0, O1, O2, O3, O4, O5, O6 and O7 when the seed address A0 is 0 in FIGS. 7 and 8.

If the test enable signal ten is deactivated and the first select signal sel1 is activated, the select signal control unit 910 activates and outputs the second input line select signal Tsel2, and accordingly, the first multiplexer unit 920 outputs the input data O0, O2, O4 and O6 applied to the odd input lines GIO0, GIO2, GIO4 and GIO6 among the eight input lines GIO0 through GIO7, as the first multiplexer data MUXR. The second multiplexer unit 930 outputs the input data O1, O3, O5, O7 applied to the even input lines GIO1, GIO3, GIO5 and GIO7 among the eight input lines GIO0 through GIO7, as the second multiplexer data MUXF. The first pipe unit 940 and the second pipe unit 950 respectively generate the first data group RDO and the second data group FDO as serial data, based on the first multiplexer data MUXR and the second multiplexer data MUXF. The first data group RDO and the second data group FDO may be generated as in case when the seed address A0 is 0 in FIG. 7. Accordingly, the waveform of the data outputted to the data pad DQ by the output driver 960 may be generated as in case when the seed address A0 is 0 in FIG. 7.

If the test enable signal ten is activated and the first select signal sel1 is activated, the select signal control unit 910 activates and outputs the first input line select signal Tsel1, and accordingly, the first multiplexer unit 920 outputs the input data O0, O2, O4 and O6 applied to the odd input lines GIO0, GIO2, GIO4 and GIO6 among the eight input lines GIO0 through GIO7, as the first multiplexer data MUXR. In the same way as in the first multiplexer unit 920, the second multiplexer unit 930 outputs the input data O0, O2, O4 and O6 applied to the odd input lines GIO0, GIO2, GIO4 and GIO6 among the eight input lines GIO0 through GIO7, as the second multiplexer data MUXF. The first pipe unit 940 and the second pipe unit 950 respectively generate the first data group RDO and the second data group FDO as serial data, based on the first multiplexer data MUXR and the second multiplexer data MUXF. The first data group RDO and the second data group FDO may be generated as in case when the seed address A0 is 0 in FIG. 8. Accordingly, the waveform of the data outputted to the data pad DQ by the output driver 960 may be generated as in case when the seed address A0 is 0 in FIG. 8.

If the test enable signal ten is activated and the second select signal sel2 is activated, the select signal control unit 910 activates and outputs the second input line select signal Tsel2, and accordingly, the first multiplexer unit 920 outputs the input data O1, O3, O5 and O7 applied to the even input lines GIO1, GIO3, GIO5 and GIO7 among the eight input lines GIO0 through GIO7, as the first multiplexer data MUXR. In the same way as in the first multiplexer unit 920, the second multiplexer unit 930 outputs the input data O1, O3, O5 and O7 applied to the even input lines GIO1, GIO3, GIO5 and GIO7 among the eight input lines GIO0 through GIO7, as the second multiplexer data MUXF. The first pipe unit 940 and the second pipe unit 950 respectively generate the first data group RDO and the second data group FDO as serial data, based on the first multiplexer data MUXR and the second multiplexer data MUXF. The first data group RDO and the second data group FDO may be generated as in case when the seed address A0 is 1 in FIG. 8. Accordingly, the waveform of the data outputted to the data pad DQ by the output driver 960 may be generated as in case when the seed address A0 is 1 in FIG. 8.

Referring to FIG. 11b, the first multiplexer unit 920 may be configured to additionally include delay circuits 1109 which receive the first select signal sel1 or the second select signal sel2 and delay the first select signal sel1 or the second select signal sel2 by a predetermined time. The delaying operations for the predetermined time by the delay circuits 1109 are to match the activation timing of the first multiplexer unit 920 which is activated by receiving the first select signal sel1 and the second select signal sel2 and the activation timing of the second multiplexer unit 930 which is activated by receiving the first input line select signal Tsel1 and the second input line select signal Tsel2. As shown in FIG. 9, the first multiplexer unit 920 operates immediately when receiving the first select signal sel1 or the second select signal sel2, whereas the second multiplexer unit 930 operates when the first select signal sel1 or the second select signal sel2 is inputted to the select signal control unit 910 and the first input line select signal Tsel1 and the second input line select signal Tsel2 are outputted by the select signal control unit 910. In an actual circuit, a predetermined time is required for the select signal control unit 910 to generate the first input line select signal Tsel1 and the second input line select signal Tsel2. In this case, a timing at which the first select signal sel1 or the second select signal sel2 is inputted to the first multiplexer unit 920 and a timing at which the first input line select signal Tsel1 and the second input line select signal Tsel2 are inputted to the second multiplexer unit 930 become different from each other. The delay circuits 1109 of the first multiplexer unit 920 shown in FIG. 11b are to compensate for a timing difference in this case. Hence, the predetermined time, during which the delay circuits 1109 receive and delay the first select signal sel1 or the second select signal sel2, corresponds to a time interval from a time at which the first select signal sel1 or the second select signal sel2 is inputted to a time at which the first input line select signal Tsel1 or the second input line select signal Tsel2 is generated, based on the selecting operation of the select signal control unit 910.

The high speed semiconductor apparatus in accordance with the embodiment of the present invention outputs a data strobe signal (DQS) at a high speed to the high speed test equipment when loaded on the high speed test equipment (in a normal mode), and outputs the data strobe signal (DQS) at a low speed to the low speed test equipment when loaded on the low speed test equipment (in a test mode). In this way, the high speed semiconductor apparatus in accordance with the embodiment of the present invention can be loaded on both the high speed and low speed test equipments so that tests can be performed. The control of a speed, at which the high speed semiconductor apparatus outputs the data strobe signal (DQS), can be implemented by the following methods.

Figure 12:
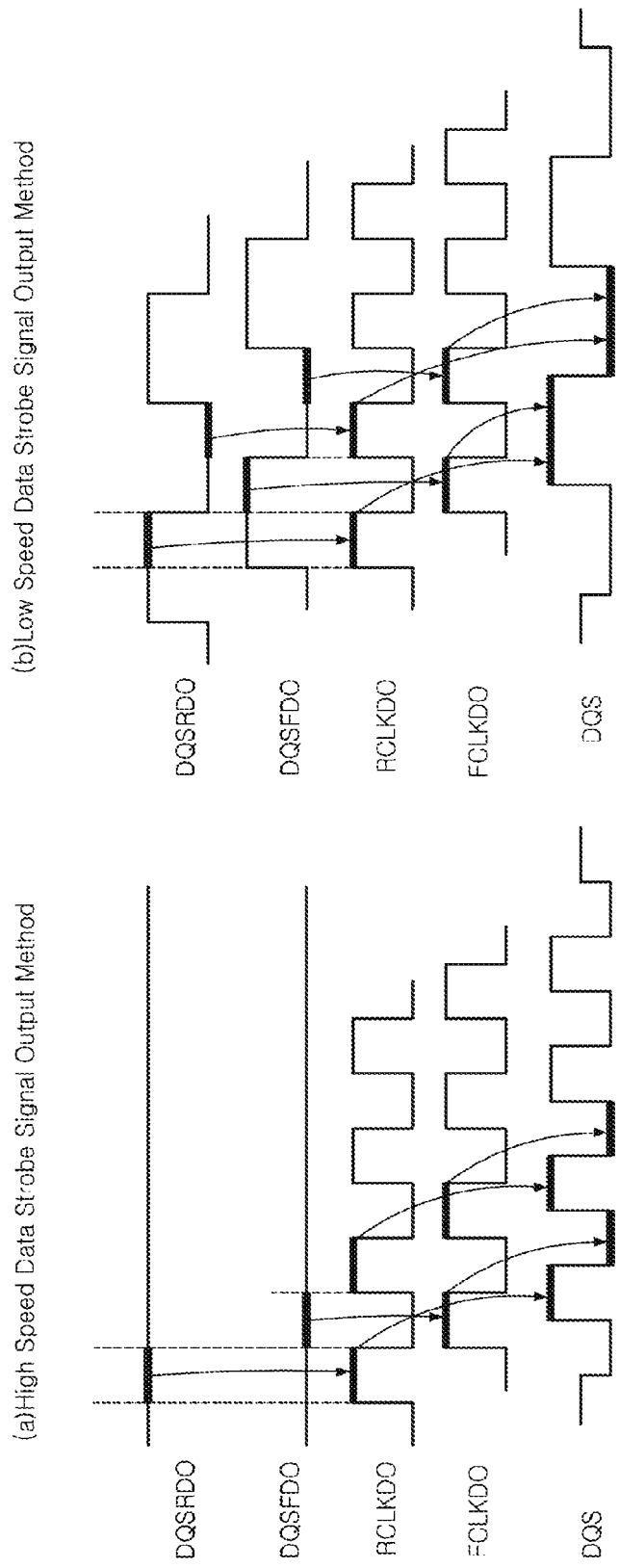
FIG. 12 is of timing diagrams illustrating a high speed data strobe signal output method (a) and a low speed data strobe signal output method (b) in the semiconductor apparatus in accordance with the embodiment of the present invention.

FIG. 12 is of timing diagrams illustrating a high speed data strobe signal output method (a) and a low speed data strobe signal output method (b) in the semiconductor apparatus in accordance with the embodiment of the present invention.

Referring to the high speed data strobe signal output method (a) shown in FIG. 12, a first DQS source signal DQSRDO is a status signal which maintains a high level, and a second DQS source signal DQSFDO is a status signal which maintains a low level. In the high speed data strobe signal output method, the first DQS source signal DQSRDO and the second DQS source signal DQSFDO are alternately outputted in response to a first output pulse RCLKDO and a second output pulse FCLKDO, respectively, by which the data strobe signal DQS is generated. Describing in detail, in the high speed data strobe signal output method, the first DQS source signal DQSRDO is received and is outputted as the data strobe signal DQS during the high level duration of the first output pulse RCLKDO, and the second DQS source signal DQSFDO is received and is outputted as the data strobe signal DQS during the high level duration of the second output pulse FCLKDO. A predetermined delay time is present from a timing at which the first output pulse FCLKDO and the second output pulse FCLKDO are activated to a timing at which the data strobe signal DQS is outputted, due to the reception and output operations. The first output pulse RCLKDO and the second output pulse FCLKDO are signals which are generated based on the input clock CLK_DLL and have a phase difference of one half cycle. In the high speed data strobe signal output method, the first DQS source signal DQSRDO and the second DQS source signal DQSFDO are alternately outputted. In the high speed data strobe signal output method, since the first DQS source signal DQSRDO maintains the high level and the second DQS source signal DQSFDO maintains the low level, the data strobe signal DQS is a swing signal which swings between a high level and a low level for a predetermined period based on the first output pulse RCLKDO and the second output pulse FCLKDO. The swing cycle of the data strobe signal DQS corresponds to one cycle of the input clock CLK_DLL. In the present embodiment, the first output pulse RCLKDO and the second output pulse FCLKDO may be realized using a rising output clock and a falling output clock which are used in a semiconductor memory apparatus such as a DRAM. In a general semiconductor memory apparatus, the rising output clock and the falling output clock are signals which control timings for outputting a data strobe signal to be used in a DDR structure.

Referring to the low speed data strobe signal output method (b) shown in FIG. 12, unlike the high speed data strobe signal output method (a) shown in FIG. 12, a first DQS source signal DQSRDO is a signal which swings for a predetermined period with a cycle corresponding to two times of the cycle of the input clock CLK_DLL, and a second DQS source signal DQSFDO is a signal which is acquired by delaying the first DQS source signal DQSRDO by one half cycle of the input clock CLK_DLL. In the same manner as in the high speed data strobe signal output method (a) shown in FIG. 12, in the low speed data strobe signal output method, the first DQS source signal DQSRDO and the second DQS source signal DQSFDO are alternately outputted in response to a first output pulse RCLKDO and a second output pulse FCLKDO, respectively, by which the data strobe signal DQS is generated. Describing in detail, in the low speed data strobe signal output method, the first DQS source signal DQSRDO is received and is outputted as the data strobe signal DQS during the high level duration of the first output pulse RCLKDO, and the second DQS source signal DQSFDO is received and is outputted as the data strobe signal DQS during the high level duration of the second output pulse FCLKDO. A predetermined delay time is present from a timing at which the first output pulse FCLKDO and the second output pulse FCLKDO are activated to a timing at which the data strobe signal DQS is outputted, due to the reception and output operations. In the low speed data strobe signal output method, unlike the high speed data strobe signal output method (a) shown in FIG. 12, the first DQS source signal DQSRDO and the second DQS source signal DQSFDO are signals which swing with a cycle corresponding to two times of the cycle of the input clock CLK_DLL and, as shown in the low speed data strobe signal output method (b) of FIG. 12, have a high level and a low level in response to the high level durations of the first output pulse RCLKDO and the second output pulse FCLKDO. Accordingly, as shown in the low speed data strobe signal output method (b) of FIG. 12, the data strobe signal DQS is a signal which swings between a high level and a low level for a predetermined period based on the first output pulse RCLKDO and the second output pulse FCLKDO. The swing cycle of the data strobe signal DQS corresponds to two cycles of the input clock CLK_DLL.

As can be seen from (a) and (b) in FIG. 12, due to the fact that the first DQS source signal DQSRDO and the second DQS source signal DQSFDO are differently generated according to the normal mode and the test mode, the high speed semiconductor apparatus in accordance with the embodiment of the present invention can control a speed at which the data strobe signal DQS is outputted. Since the data strobe signal DQS is a signal which is generated when a read command is activated in a semiconductor memory apparatus, the high speed and low speed data strobe signal output methods of the high speed semiconductor apparatus may be configured to start in response to the read command. In case when the high speed semiconductor apparatus is loaded on the low speed test equipment and tests are performed (in the test mode), the low speed data strobe signal output method may be employed, and in case when the high speed semiconductor apparatus is loaded on the high speed test equipment and tests are performed or the high speed semiconductor apparatus operates at a high speed in a packaged state (in the normal mode), the high speed data strobe signal output method may be employed.

Figure 13:
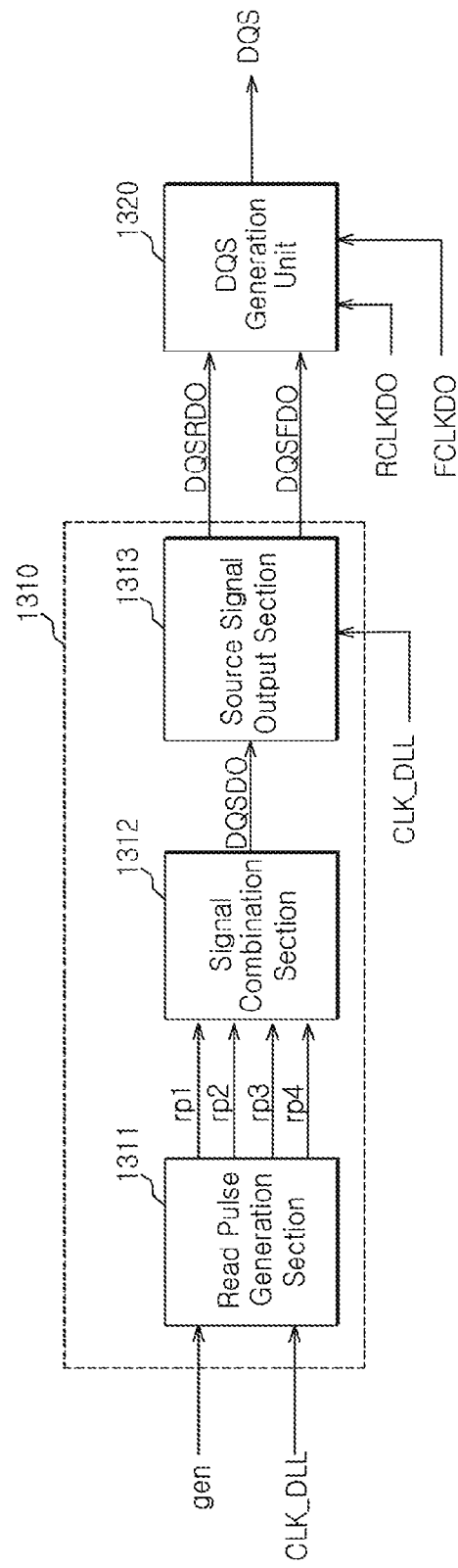
FIG. 13 is a schematic block diagram illustrating an exemplary embodiment of a data strobe signal (DQS) generation device which is configured to use the low speed data strobe signal output method (b) shown in FIG. 12.

FIG. 13 is a schematic block diagram illustrating an exemplary embodiment of a data strobe signal (DQS) generation device which is configured to use the low speed data strobe signal output method (b) shown in FIG. 12.

The data strobe signal generation device may be configured to include a DQS source signal generation unit 1310 and a DQS generation unit 1320.

As described above, in the low speed data strobe signal output method (b) shown in FIG. 12, unlike the high speed data strobe signal output method (a) shown in FIG. 12, the first DQS source signal DQSRDO and the second DQS source signal DQSFDO are generated as swing signals, and the data strobe signal DQS is outputted at a low speed. The DQS source signal generation unit 1310 is a component part which generates the first DQS source signal DQSRDO and the second DQS source signal DQSFDO as swing signals. The DQS source signal generation unit 1310 is configured to generate the first DQS source signal DQSRDO and the second DQS source signal DQSFDO as swing signals in response to a generation start signal gen and the input clock CLK_DLL.

The DQS generation unit 1320 is configured to perform an operation on the first DQS source signal DQSRDO and the second DQS source signal DQSFDO in synchronization with the first output pulse RCLKDO and the second output pulse FCLKDO and generate the data strobe signal DQS which has a swing cycle corresponding to two times of the cycle of the input clock CLK_DLL. The DQS generation unit 1320 may include a general data strobe signal driver. For example, the DQS generation unit 1320 may be configured to include a driver circuit which outputs the first DQS source signal DQSRDO as the data strobe signal DQS during the high level duration of the first output pulse RCLKDO and outputs the second DQS source signal DQSFDO as the data strobe signal DQS during the high level duration of the second output pulse FCLKDO. Since the DQS generation unit 1320 may be easily realized to include a driver circuit generally known in the art, detailed description thereof will be omitted herein.

The DQS source signal generation unit 1310 may be configured to include a read pulse generation section 1311, a signal combination section 1312, and a source signal output section 1313. The DQS source signal generation unit 1310 generates a DQS setting signal DQSDO as a swing signal through the read pulse generation section 1311 and the signal combination section 1312. The source signal output section 1313 is configured to receive the DQS setting signal DQSDO, delay the DQS setting signal DQSDO by a preselected time, and generate the first DQS source signal DQSRDO and the second DQS source signal DQSFDO.

The read pulse generation section 1311 is configured to generate a plurality of read pulse signals which are sequentially activated, in response to the generation start signal gen and the input clock CLK_DLL. In FIG. 13, four read pulse signals, that is, first through fourth read pulse signals rp1 through rp4 are shown. The generation start signal gen is a signal which is acquired by changing a read command pulse to the domain of the input clock CLK_DLL.

The signal combination section 1312 is configured to receive the plurality of read pulse signals rp1 through rp4 and generate the DQS setting signal DQSDO, such that the DQS setting signal DQSDO swings with the pulse width of the plurality of read pulse signals rp1 through rp4 for a predetermined period.

The source signal output section 1313 receives the DQS setting signal DQSDO, delays the DQS setting signal DQSDO by the preselected time through performing an operation in synchronization with the input clock CLK_DLL, and generate the first DQS source signal DQSRDO and the second DQS source signal DQSFDO. As described above, since the DQS setting signal DQSDO is a swing signal, the first DQS source signal DQSRDO and the second DQS source signal DQSFDO become swing signals as well.

Figure 14:
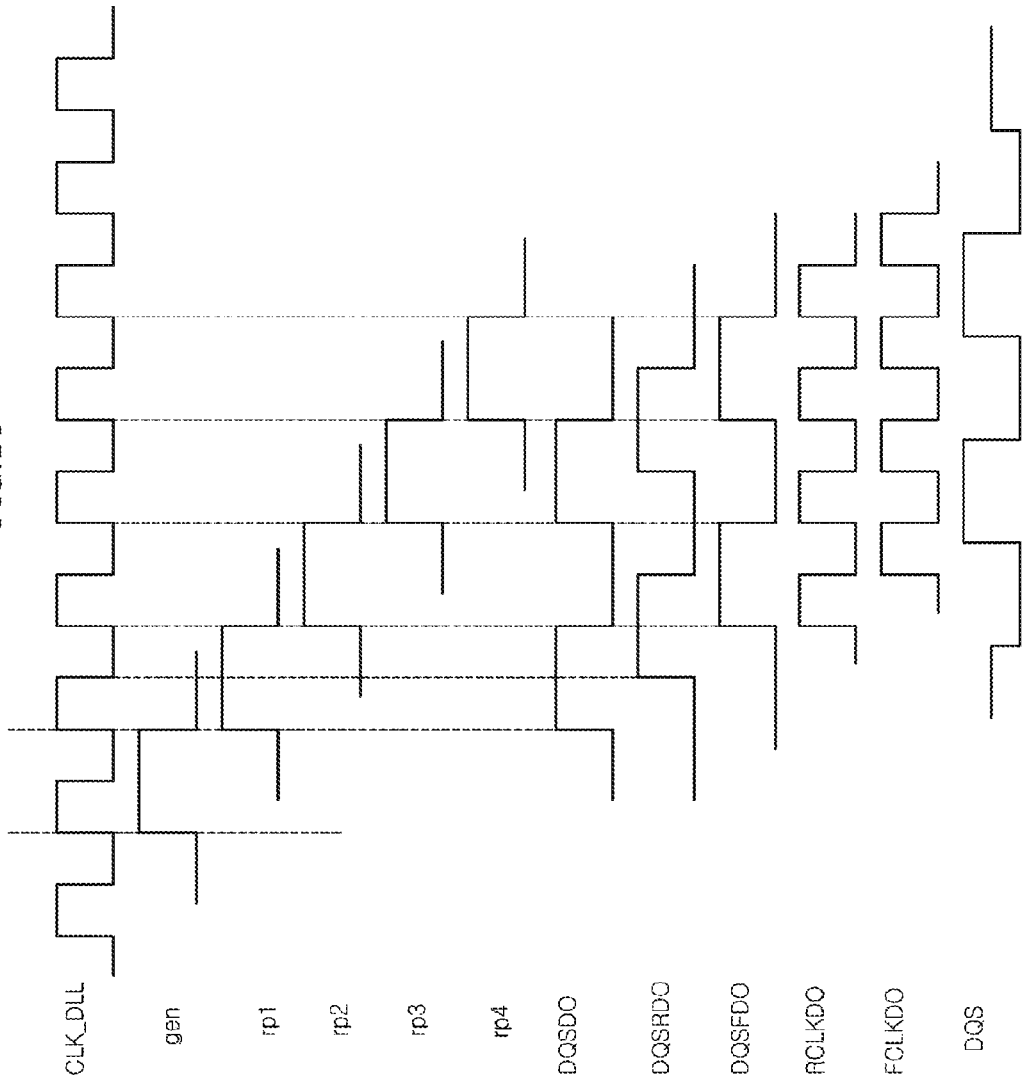
FIG. 14 is a timing diagram illustrating operations of the DQS generation device shown in FIG. 13.

Operations of the DQS generation device shown in FIG. 13 will be described on a time basis with reference to FIG. 14. FIG. 14 is a timing diagram illustrating operations of the DQS generation device shown in FIG. 13.

Referring to FIG. 14, signals which are inputted and outputted to and from the DQS generation device, and the input clock CLK_DLL as a reference for the operations of the signals generated in the DQS generation device are shown. The input clock CLK_DLL is a signal which is generated based on the external clock CLK_ex. As aforementioned above, since the external clock CLK_ex is a signal inputted at a high speed, the input clock CLK_DLL is also a high speed signal. The input clock CLK_DLL is provided to the read pulse generation section 1311 and the source signal output section 1313.

The generation start signal gen, as a signal which is acquired by changing the read command pulse to the domain of the input clock CLK_DLL, is inputted to the read pulse generation section 1311. As shown in FIG. 14, since the generation start signal gen has the same domain as the input clock CLK_DLL, the activation timing and the deactivation timing of the generation start signal gen correspond to the rising edge of the input clock CLK_DLL, and the pulse width of the generation start signal gen corresponds to one cycle of the input clock CLK_DLL.

The read pulse generation section 1311 sequentially delays the generation start signal gen by the pulse width of the generation start signal gen through performing an operation in synchronization with the input clock CLK_DLL, and generates the first through fourth read pulse signals rp1 through rp4 as shown in FIG. 14. The read pulse generation section 1311 may be configured to include a plurality of flip-flop circuits and a plurality of delay circuits which are well known in the art and perform operations in synchronization with the input clock CLK_DLL.

The signal combination section 1312 combines the first through fourth read pulse signals rp1 through rp4 and generates the DQS setting signal DQSDO as shown in FIG. 14. The signal combination section 1312 outputs the DQS setting signal DQSDO at a high level while the first and third read pulse signals rp1 and rp3 are activated, and outputs the DQS setting signal DQSDO at a low level while the second and fourth read pulse signals rp2 and rp4 are activated, by which the DQS setting signal DQSDO as a swing signal can be generated. An exemplary embodiment for realizing the signal combining section 1312 will be described below with reference to FIG. 15.

The source signal output section 1313 delays the DQS setting signal DQSDO by the preselected time through performing an operation in synchronization with the input clock CLK_DLL, and sequentially generates the first DQS source signal DQSRDO and the second DQS source signal DQSFDO as shown in FIG. 14. In FIG. 14, it is illustrated that the second DQS source signal DQSFDO is generated later by one half cycle of the input clock CLK_DLL than the first DQS source signal DQSRDO. The source signal output section 1313 may be configured to include a flip-flop circuit which is generally known in the art and receives the input clock CLK_DLL.

In FIG. 14, operations of the signals below the waveforms of the first DQS source signal DQSRDO and the second DQS source signal DQSFDO are the same as those of (b) in FIG. 12. Therefore, detailed description thereof will be omitted herein.

Figure 15:
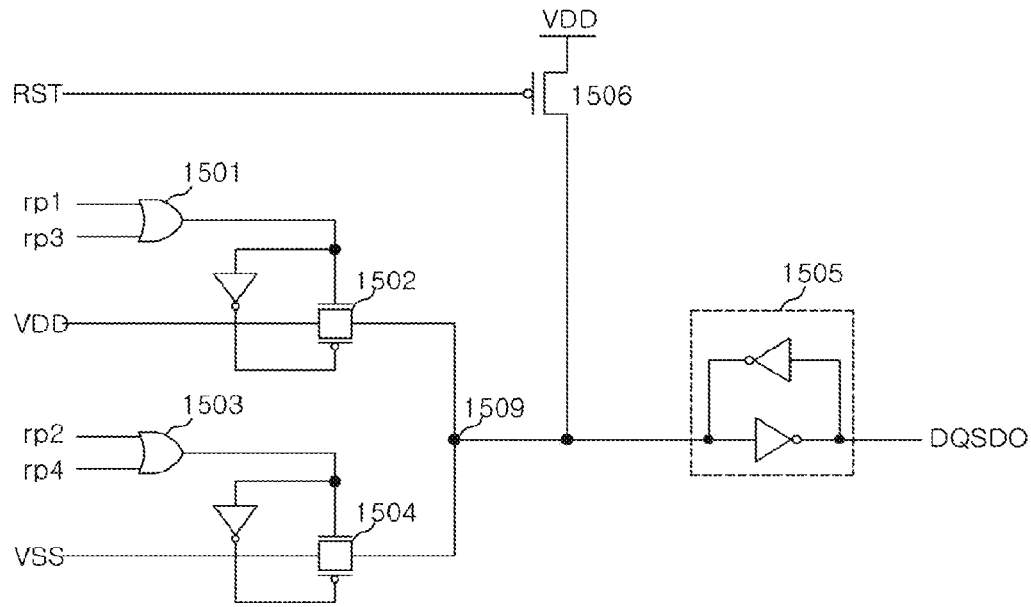
FIG. 15 is a circuit diagram illustrating an exemplary embodiment of the signal combination section shown in FIG. 13.

FIG. 15 is a circuit diagram illustrating an exemplary embodiment of the signal combination section 1312 shown in FIG. 13.

The signal combination section 1312 may be configured to include a first OR gate 1501, a first pass gate 1502, a second OR gate 1503, a second pass gate 1504, a latch circuit 1505, and a reset PMOS transistor 1506.

The first OR gate 1501 receives and Ors the first and third read pulse signals rp1 and rp3. The first pass gate 1502 is configured to output an external voltage VDD to a first node 1509 when the output signal of the first OR gate 1501 is activated.

The second OR gate 1503 receives and Ors the second and fourth read pulse signals rp2 and rp4. The second pass gate 1504 is configured to output a ground voltage VSS to the first node 1509 when the output signal of the second OR gate 1503 is activated.

The latch circuit 1505 is coupled to the first node 1509 and performs a latching operation. The output of the latch circuit 1505 is outputted as the DQS setting signal DQSDO.

The reset PMOS transistor 1506 is coupled between the external voltage VDD and the first node 1509 and receives a reset signal RST. The reset PMOS transistor 1506 serves as a component part which charges the first node 1509 in response to the reset signal RST and initializes the latch value of the latch circuit 1505, and may be omitted depending upon a design.

As can be seen from 15, the first and second OR gates 1501 and 1503 activate the first and second pass gates 1502 and 1054 in response to the first through fourth read pulse signals rp1 through rp4, and the latch circuit 1505 changes latch values to high and low levels based on the activation of the first and second pass gates 1502 and 1504 and generates the DQS setting signal DQSDO.

The input lines GIO0 through GIO7 and the output lines GIO0 through GIO7 which are mentioned in the present specification may be separately configured, and may be used by sharing the same lines like the global input/output lines of a semiconductor memory apparatus. In the present specification, the global input/output lines capable of sharing input lines and output lines are exemplarily described.

Figure 16:
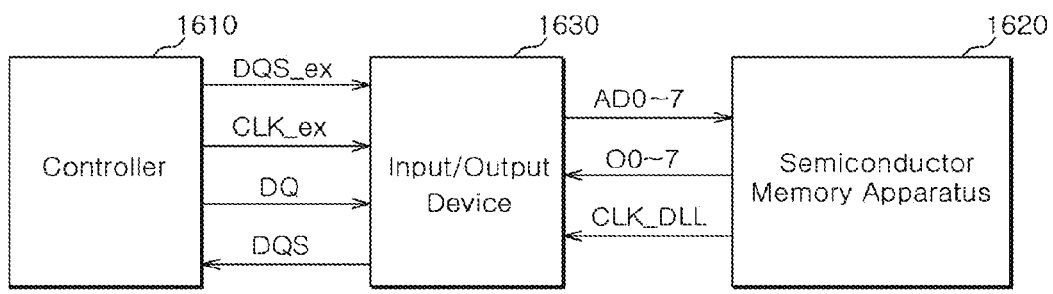
FIG. 16 is a schematic block diagram illustrating a system in accordance with another embodiment of the present invention.

The semiconductor apparatus in accordance with the embodiment of the present invention allows a high speed semiconductor memory apparatus to be loaded on a high speed or low speed controller (for example, CPU) and can be includes in the system shown in FIG. 16. Accordingly, the semiconductor apparatus in accordance with the embodiment of the present invention can be used not only in tests between a high speed semiconductor memory apparatus and a high speed or low speed semiconductor test equipment but also in tests between a high speed semiconductor memory apparatus and a high speed or low speed controller.

FIG. 16 is a schematic block diagram illustrating a system in accordance with another embodiment of the present invention.

The system may be configured to include a controller 1610, a semiconductor memory apparatus 1620, and an input/output device 1630.

The controller 1610 serves as an active device capable of operating the semiconductor memory apparatus 1620. The controller 1610 can operate at a high speed (a first speed) or a low speed (a second speed), and communicates with the semiconductor memory apparatus 1620 via the input/output device 1630.

The semiconductor memory apparatus 1620 is a memory apparatus which operates at the high speed (the first speed) and is a passive device which is driven by the controller 1620.

The input/output device 1630 controls input/output of signals between the controller 1610 and the semiconductor memory apparatus 1620 depending upon the operation speed of the controller 1610. The input/output device 1630 can operate at a normal mode which corresponds to input/output of signals between the controller 1610 operating at the high speed (the first speed) and the semiconductor memory apparatus 1620 and at a test mode which corresponds to input/output of signals between the controller 1610 operating at the low speed (the second speed) and the semiconductor memory apparatus 1620. The input/output device 1630 may be configured to include the input circuit, the output circuit and the data strobe signal generation circuit in accordance with the embodiments of the present invention which are shown in FIGS. 1 through 15.

While certain embodiments have been described above, it will be understood to those skilled in the art that the embodiments described are by way of example only. Accordingly, the input/output circuit and method of a semiconductor apparatus and the system with the same described herein should not be limited based on the described embodiments. Rather, the input/output circuit and method of a semiconductor apparatus and the system with the same described herein should only be limited in light of the claims that follow when taken in conjunction with the above description and accompanying drawings.

What is claimed is:

1. An output method of a semiconductor apparatus, comprising the steps of:
   (a) generating a first data group based on data applied to a plurality of input lines;
   (b) generating a second data group to be the same as the first data group, based on the data applied to the plurality of input lines;
   (c) outputting at least a portion of the first data group at a first timing; and
   (d) outputting at least a portion of the second data group at a second timing after the first timing.

2. The output method according to claim 1, further comprising the step of:
   (e) repeating the steps (c) and (d) until the first data group and the second data group are all outputted,
   wherein the steps (a), (b), (c), (d) and (e) are repeated twice.

3. The output method according to claim 1, wherein the first timing is a rising edge of an input clock, and the second timing is a falling edge of the input clock.

4. The output method according to claim 1, wherein the at least a portion of the second data group which is outputted in the step (d) is the same as the at least a portion of the first data group which is outputted in the step (c).

5. The output method according to claim 1,
   wherein the first data group and the second data group comprise multi-bits,
   wherein, in the step (c), one bit of the first data group is outputted at the first timing, and
   wherein, in the step (d), one bit of the second data group is outputted at the second timing.

6. The output method according to claim 1,
   wherein, in the step (a), the first data group is generated by selecting one half of the data applied to the plurality of input lines, and
   wherein, in the step (b), the second data group is generated by selecting the same one half selected in the step (a) among the data applied to the plurality of input lines.

7. The output method according to claim 6,
   wherein, in the step (a), one half of the data applied to the plurality of input lines is differently selected in response to a first select signal and a second select signal, and
   wherein, in the step (b), one half of the data applied to the plurality of input lines is differently selected in response to a first input line select signal and a second input line select signal.

8. The output method according to claim 7, further comprising the step of:
   receiving the first select signal and the second select signal, and generating the first input line select signal and the second input line select signal such that the one half selected in the step (b) among the data applied to the input lines is the same as the one half selected in the step (a).

9. The output method according to claim 1, further comprising the steps of:
   (f) generating a generation start signal in response to a read command;
   (g) generating a DQS setting signal in response to the generation start signal and the input clock;
   (h) delaying the DQS setting signal by a preset time and generating a first DQS source signal and a second DQS source signal as swing signals; and
   (i) outputting the first DQS source signal and the second DQS source signal in response to a first output pulse and a second output pulse and generating a data strobe signal.

10. The output method according to claim 9, wherein the step (g) comprises the steps of:
    delaying the generation start signal and generating a plurality of read pulse signals; and
    generating the DQS setting signal which swings with a pulse width corresponding to that of the plurality of read pulse signals, in response to the plurality of read pulse signals.

11. The output method according to claim 9, wherein a cycle of the data strobe signal corresponds to two times of a cycle of the input clock.

12. The output method according to claim 11, wherein the second DQS source signal is a signal which is acquired by delaying the first DQS source signal by one half cycle of the input clock.

13. The output method according to claim 12, wherein the generation start signal is a pulse signal which has a pulse width corresponding to one cycle of the input clock.

* * * * *